United States Patent [19]
Taneya et al.

[11] Patent Number: 5,488,678
[45] Date of Patent: Jan. 30, 1996

[54] ASSEMBLY STRUCTURE FOR AN OPTICAL INTEGRATED CIRCUIT DEVICE

[75] Inventors: Mototaka Taneya; Hidenori Kawanishi, both of Nara; Tatsuya Morioka, Tenri; Atsushi Shimonaka, Nara, all of Japan

[73] Assignee: Sharp Kabushiki Kaisha, Osaka, Japan

[21] Appl. No.: 283,743

[22] Filed: Aug. 1, 1994

[30] Foreign Application Priority Data

Aug. 3, 1993 [JP] Japan .................. 5-192608

[51] Int. Cl.⁶ .................................. G02B 6/12
[52] U.S. Cl. ..................... 385/14; 385/49; 385/130; 385/131; 372/43; 372/50
[58] Field of Search .................. 385/14, 39, 52, 385/129, 130, 131, 132, 49, 50; 372/43, 50, 7

[56] References Cited

U.S. PATENT DOCUMENTS 5,159,700  10/1992  Reid et al. .................. 385/14

FOREIGN PATENT DOCUMENTS 4-159788  6/1992  Japan .................. 385/14 X

*Primary Examiner*—Brian Healy
*Attorney, Agent, or Firm*—Birch, Stewart, Kolasch & Birch

[57] ABSTRACT

In an assembly structure of an optical integrated circuit device for assembling a semiconductor laser device and an optical integrated circuit substrate, the semiconductor laser device includes a recessed/raised structure. On the other hand, the optical integrated circuit substrate includes another recessed/raised structure to fit the recessed/raised structure of the semiconductor laser device. These recessed/raised structures are formed so that their cross sections taken parallel to the layers forming the semiconductor laser device are symmetric in shape about the respective optical axes of the semiconductor laser device and the optical integrated circuit substrate. Further, the recessed/raised structures preferably contain a tapered portion as part of its contour, the taper forming a prescribed angle with the respective optical axes. Thus, the mounting accuracy required to achieve the prescribed coupling efficiency in the optical integrated circuit device can be obtained by simple mechanical operations.

5 Claims, 10 Drawing Sheets

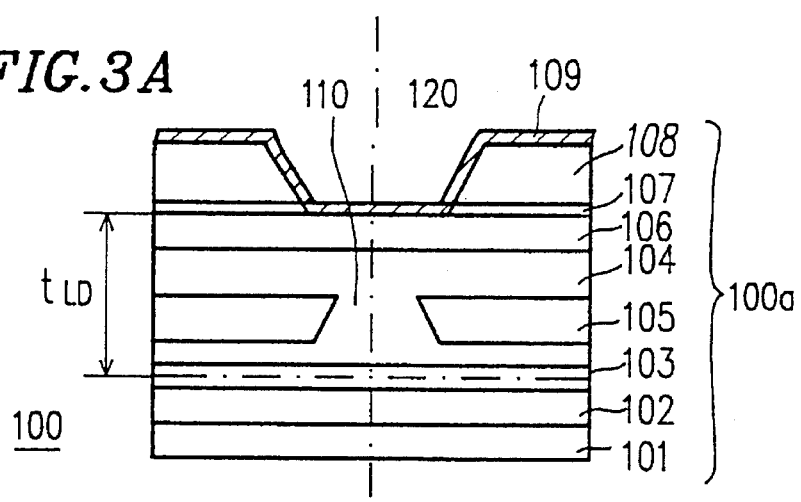
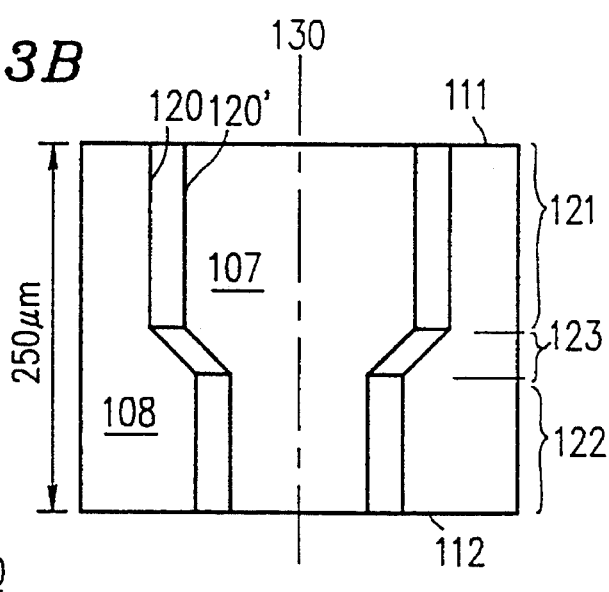
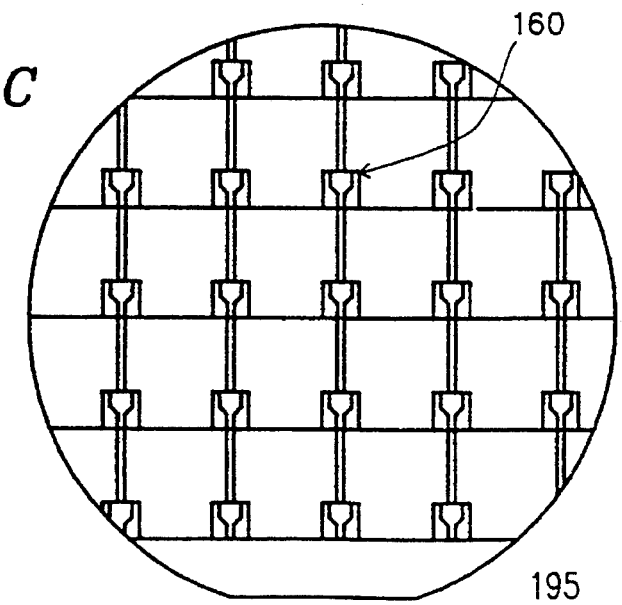

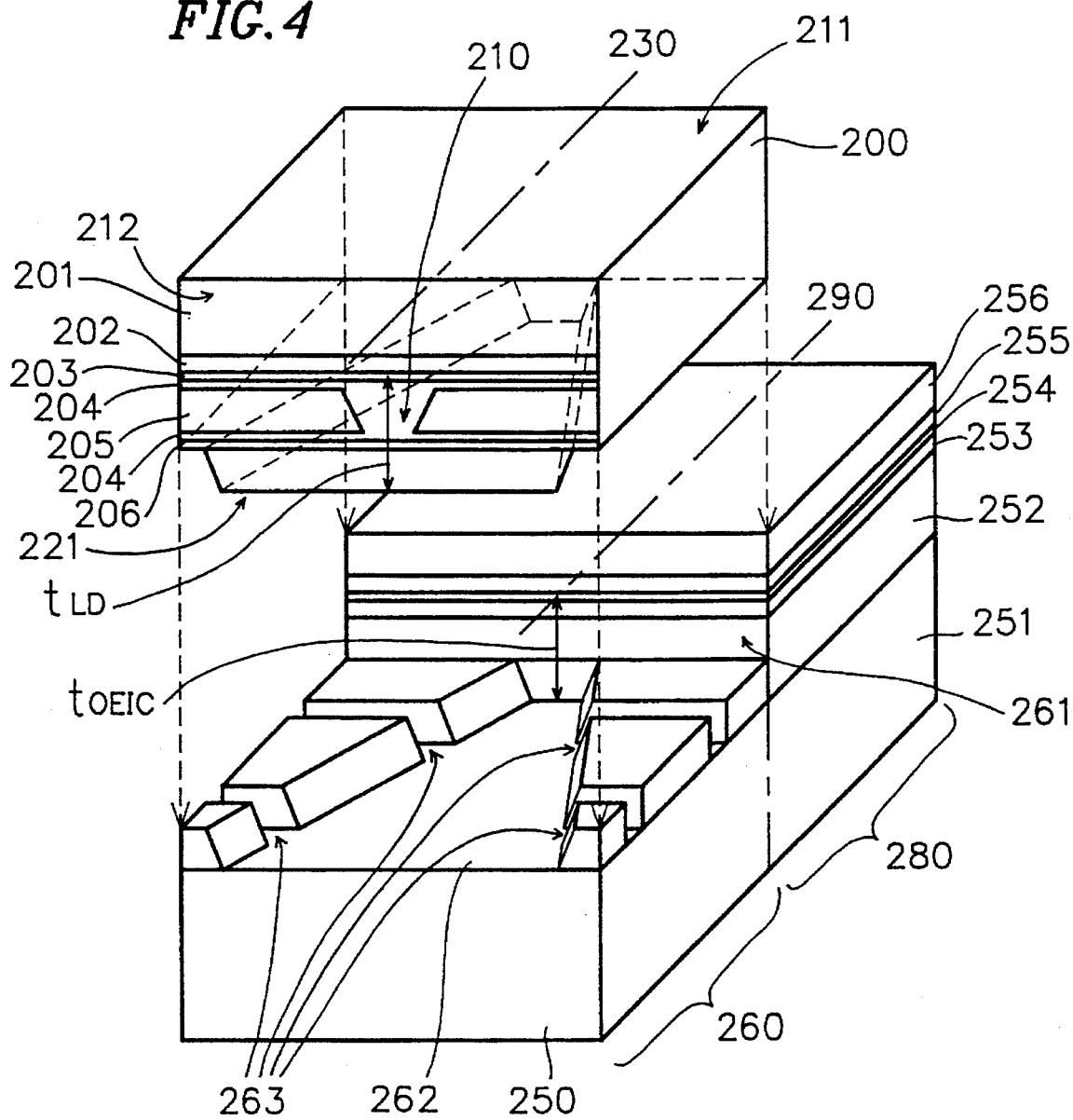

ASSEMBLY STRUCTURE FOR AN OPTICAL INTEGRATED CIRCUIT DEVICE

BACKGROUND OF THE INVENTION

1. Field of the Invention

The present invention relates to an assembly structure for an optical integrated circuit device comprising a semiconductor laser device secured to an optical integrated circuit substrate, and a method for assembling the same.

2. Description of the Related Art

An optical integrated circuit device is one of the basic devices in the fields of optical communications, optical information processing, optical measurement, etc. Among others, an optical integrated circuit device using a semiconductor laser as a light source is indispensable for the realization of ultra-high-speed optical communications, super parallel optical information processing, high-precision optical measurement, etc.

FIG. 1 is a simplified schematic diagram showing an example of an optical integrated circuit device 90 having a semiconductor laser device 80 as a light source. In this optical integrated circuit device 90, the semiconductor laser device 80 and a waveguide device 5 having a waveguiding structure for controlling light waves are formed on a common substrate 50. In building such an optical integrated circuit device 90, design and fabrication of the semiconductor laser device 80 and the waveguide device 5 can be made easier by forming these two devices 80 and 5 using different materials rather than integrating them using an identical material.

Accordingly, it is common practice to form the semiconductor laser device 80 and the waveguide device 5 separately, and then mount them in place on the common substrate 50. The most important thing in this process is to ensure enough optical coupling efficiency in coupling between a light-emitting layer 11 in the semiconductor laser device 80 and an optical waveguiding layer (simply referred to as the waveguide hereinafter) 6 in the waveguide device 5.

In the above mounting process, the semiconductor laser device 80 and the waveguide device 5 need to be aligned with each other. The alignment is usually done in one of the following two ways. One involves an optical method in which light emitted from the semiconductor laser device 80 is converged by a lens to the waveguide 6 in the waveguide device 5. The alignment is adjusted by checking whether a prescribed light collection rate is achieved. The other is a butt-coupling method in which the light-emitting layer 11 in the semiconductor laser device 80 and the waveguide 6 in the waveguide device 5 are arranged while butting each other so that the two layers 6 and 11 are directly coupled with each other.

The optical method using a lens requires alignment among three devices, i.e., alignment among the semiconductor laser device, the waveguide device, and the lens. Accurately aligning these devices to one another to complete a chip is an extremely difficult job. Therefore, the butt-coupling method is often used in preference to the optical method.

FIG. 2 is a schematic diagram for explaining a method of assembling the optical integrated circuit device 90 by coupling the semiconductor laser device 80 and the waveguide device 5 together by the butt-coupling method.

In this method, light emitted from the semiconductor laser device 80 is directly fed into the waveguide 6 of the waveguide device 5. The light 12 exiting the waveguide 6 is received by a light detector 10 which detects the intensity of the light 12. The optimum relative positioning between the semiconductor laser device 80 and the waveguide device 5 is determined as the point where the largest current value is detected by the light detector 10.

In this butt-coupling method, the semiconductor laser device 80 is driven to emit light for coupling to the waveguide device 5, as described above. To prevent degradation of the semiconductor laser device 80 by the heat generated during the light emission, the semiconductor laser device 80 is held in intimate contact with a heat sink substrate 1. On the other hand, the waveguide device 5 is placed in a movable state.

The above butt-coupling method will be described in further detail below.

First, the semiconductor laser device 80 is held firmly in intimate contact with the surface of the heat sink substrate 1, which is made of silicon or the like, and the heat sink substrate 1 is secured to a stem 2. The semiconductor laser device 80 is connected by an electrode wire 3 to an electrode pin 4 provided on the stem 2. A current is fed from the electrode pin 4 to the semiconductor laser device 80 through the electrode wire 3, and this current drives the semiconductor laser device 80 to emit light.

Next, with the semiconductor laser device 80 continuously driven to emit light, the waveguide device 5 in chip form is placed on the stem 2 and moved toward the semiconductor laser device 80. The waveguide device 5 has a multilayered structure with the waveguide 6 formed at the same height as the light-emitting layer 11 of the semiconductor laser device 80. While the waveguide device 5 is being moved, the light emitted from a light-emitting part 8 of the semiconductor laser device 80 enters the waveguide 6 through a light input facet 7. The incident light propagates through the waveguide 6 and emerges from a light exit facet 9 of the waveguide 6. This emergent light 12 is received by the light detector 10 to detect the intensity of the light 12. The waveguide device 5 is incrementally moved in three crossed directions, and the position where the largest current value is detected by the light detector 10 is determined as the optimum mounting position.

Once the optimum alignment is achieved, an ultraviolet curing resin (not shown) is applied over the waveguide device 5. This resin is then cured by exposure to ultraviolet radiation, to fix the waveguide device 5 in position.

However, the above-described prior art has the following problems.

Firstly, since the waveguide device 5 has to be moved along the heat sink substrate 1 for alignment, the waveguide devices 5 as fabricated on a wafer cannot be handled. A wafer containing many waveguide devices 5 has to be separated into chips first, and alignment work has to be performed on each individual device separated as a chip. The result is low productivity.

Secondly, the process involved is very complex.

Thirdly, for obtaining maximum optical coupling efficiency, not only the positioning accuracy in the direction parallel to the layers of the semiconductor laser device 80, but the tilting within a plane perpendicular to the layer containing the optical axis of the light-emitting layer 11 of the semiconductor laser device 80 needs to be controlled. Generally, the positioning accuracy required in butt-coupling two waveguides is 1 μm or less in either of two directions perpendicular to the waveguide optical axis (one is a thickness direction across the thickness of the layer forming the waveguide, and the other is a direction perpendicular both to the thickness direction of the layer forming the waveguide and to the waveguide optical axis). In particular, the alignment in the thickness direction of the layer forming the waveguide demands an extremely high accuracy of 0.5 µm or less. In the above prior art method, since the waveguide in chip form has to be moved while constantly monitoring the current value being detected by the light detector, not only the productivity but the fabrication yield suffers.

SUMMARY OF THE INVENTION

The assembly structure for an optical integrated circuit device of this invention includes: an optical integrated circuit substrate in which a layered structure including a waveguide is formed on a base, the optical integrated circuit substrate having a first surface profile on an opposite surface of the base, the first surface profile including a first structure which is one of a raised structure and a recessed structure; and a semiconductor laser device to be secured on the optical integrated circuit substrate, the semiconductor laser device having a plurality of layers and a second surface profile on a surface of the layers, the second surface profile corresponding to the first surface profile and including a second structure which has a shape corresponding to the first structure on the optical integrated circuit substrate, wherein the first structure extends parallel to a waveguide axis of the optical integrated circuit substrate, a cross-sectional shape of the first structure taken parallel to the base is symmetrical with respect to the waveguide axis, and the first structure includes a first tapered profile, the second structure extends parallel to a light-emitting stripe axis of the semiconductor laser device, a cross-sectional shape of the second structure taken parallel to the layers is symmetrical with respect to the light-emitting stripe axis, and the second structure includes a second tapered profile which corresponds to the first tapered profile of the first structure, and the first and second surface profiles are fitted to and bonded with each other so as to secure the semiconductor laser device to the optical integrated circuit substrate.

In one embodiment, the first surface profile includes a plurality of the first structures and the second surface profile includes a plurality of the second structures.

In another embodiment, one of the first surface profile and the second surface profile further includes a groove for venting air from an interface between the first and second surface profiles in fitting and bonding the first and second surface structures.

According to another aspect of the invention, the assembly structure for an optical integrated circuit device includes: an optical integrated circuit substrate in which a layered structure including a waveguide is formed on a base, the optical integrated circuit substrate having a first surface profile on an opposite surface of the base; and a semiconductor laser device to be secured on the optical integrated circuit substrate, the semiconductor laser device having a plurality of layers and a second surface profile on a surface of the layers, the second surface profile corresponding to the first surface profile, wherein the first and second surface profiles are faced to and bonded with each other so as to secure the semiconductor laser device to the optical integrated circuit substrate, and at least one of the first surface profile and the second surface profile includes at least one raised portion providing a touching face which is brought into contact with a corresponding touching face in the opposite surface profile, the touching faces being used for controlling dimension in a direction perpendicular to the layers in the semiconductor laser device in facing and bonding of the semiconductor laser device and the optical integrated circuit substrate.

In one embodiment, the semiconductor laser device further includes a light converging means for increasing collimation of light emitted from the semiconductor laser device.

The method for assembling an optical integrated circuit device of the invention includes the steps of: providing an optical integrated circuit substrate in which a layered structure including a waveguide is formed on a base; forming a first surface profile on an opposite surface of the base of the optical integrated circuit substrate, the first surface profile including a first structure which is one of a raised structure and a recessed structure, wherein the first structure extends parallel to a waveguide axis of the optical integrated circuit substrate, a cross-sectional shape of the first structure taken parallel to the base is symmetrical with respect to the waveguide axis, and the first structure includes a first tapered profile; providing a semiconductor laser device to be secured on the optical integrated circuit substrate, the semiconductor laser device having a plurality of layers; forming a second surface profile on a surface of the layers of the semiconductor laser device, the second surface profile corresponding to the first surface profile and including a second structure which has a shape corresponding to the first structure on the optical integrated circuit substrate, wherein the second structure extends parallel to a light-emitting stripe axis of the semiconductor laser device, a cross-sectional shape of the second structure taken parallel to the layers is symmetrical with respect to the light-emitting stripe axis, and the second structure includes a second tapered profile which corresponds to the first tapered profile of the first structure; placing the semiconductor laser device on the optical integrated circuit device so that the first and second surface profiles face and fit to each other; moving the semiconductor laser device along a longitudinal direction on the optical integrated circuit substrate until the first and second tapered profiles of the first and second surface profiles firmly contact each other; and bonding the semiconductor laser device and the optical integrated circuit substrate.

In one embodiment, the first surface profile includes a plurality of the first structures and the second surface profile includes a plurality of the second structures.

In another embodiment, the method further includes the step of providing a groove in one of the first surface profile and the second surface profile for venting air from an interface between the first profile and the second profile in fitting and bonding of the first and second surface profiles.

According to another aspect of the invention, the method for assembling an optical integrated circuit device includes the steps of: providing an optical integrated circuit substrate in which a layered structure including a waveguide is formed on a base, the optical integrated circuit substrate having a first surface profile on an opposite surface of the base; providing a semiconductor laser device to be secured on the optical integrated circuit substrate, the semiconductor laser device having a plurality of layers and a second surface profile on a surface of the layers, the second surface profile corresponding to the first surface profile; forming at least one raised portion in at least one of the first surface profile and the second surface profile, the at least one raised portion providing a touching face which is brought into contact with a corresponding touching face in the opposite surface profile, the touching faces being used for controlling dimension in a direction perpendicular to the layers of the semiconductor laser device in facing and bonding of the semiconductor laser device and the optical integrated circuit substrate; and making the first and second surface profiles face to and bond with each other so as to secure the semiconductor laser device to the optical integrated circuit substrate.

In one embodiment, the method further includes the step of providing a light converging means in the semiconductor laser device for increasing collimation of light emitted from the semiconductor laser device.

Thus, the invention described herein makes possible the advantages of, in the fabrication of an optical integrated circuit device having a semiconductor laser device as a light source, (1) providing an assembly structure capable of accurately coupling the semiconductor laser device to a waveguide device (an optical integrated circuit substrate) on a substrate and achieving efficient and high-yield fabrication of the optical integrated circuit device, and (2) providing a method for assembling the same.

These and other advantages of the present invention will become apparent to those skilled in the art upon reading and understanding the following detailed description with reference to the accompanying figures.

BRIEF DESCRIPTION OF THE DRAWINGS

FIGS. 3A–3F are diagrams illustrating an assembly structure in accordance with a first example of the invention.

FIG. 4 is a diagram illustrating an assembly structure in accordance with a second example of the invention.

DESCRIPTION OF THE PREFERRED EMBODIMENTS

Figure 1:
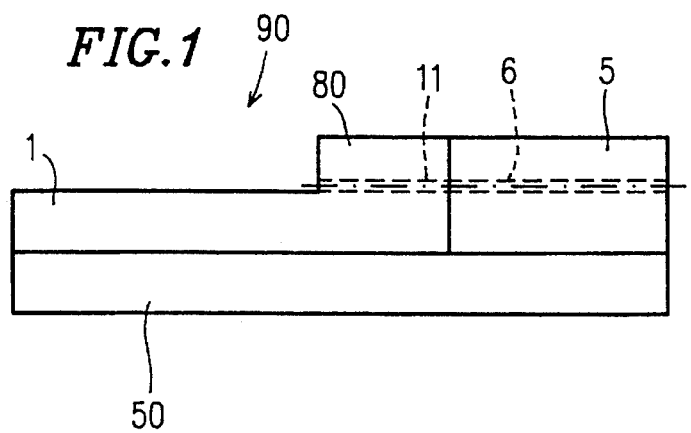
FIG. 1 is a simplified schematic diagram showing an example of an optical integrated circuit device.
Figure 2:
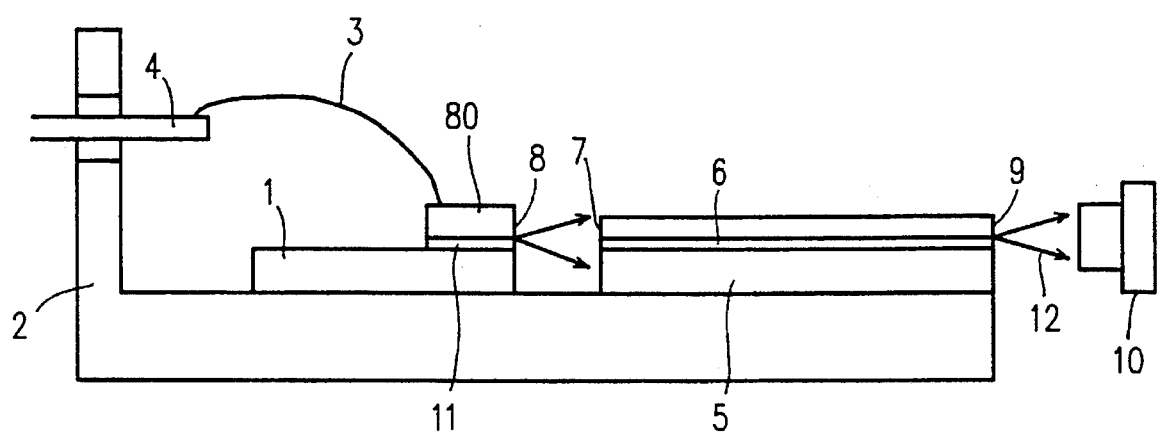
FIG. 2 is a schematic diagram explaining a conventional method for assembling the optical integrated circuit device.

Hereinafter, the present invention will be described by way of examples.

EXAMPLE 1

FIG. 3A is a front view of a semiconductor laser device 100 according to a first example of the invention, and FIG. 3B is a top plan view of the same. The semiconductor laser device 100 is an ordinary buried-stripe geometrical semiconductor laser device.

In the semiconductor laser device 100, an n-$Al_{0.5}Ga_{0.5}As$ cladding layer 102 is formed to a thickness of 1.2 μm over the entire surface of an n-GaAs substrate 101 that serves as a base. On top of the cladding layer 102 are formed a GaAs active layer 103 of 80 nm thickness, a p-$Al_{0.5}Ga_{0.5}As$ cladding layer 104 of 2.0 μm thickness, an n-GaAs current constricting layer 105 of 0.8 μm thickness, a p-GaAs first contact layer 106 of 0.5 μm thickness, a p-$Al_{0.45}Ga_{0.55}As$ etching stop layer 107 of 50 nm thickness, and a p-GaAs processed layer 108 of 1.0 μm thickness; these layers, with identical surface geometry, are formed one on top of another in the order stated, to form the layered structure 100a. Of these layers, a portion of the current constricting layer 105 is removed in a stripe pattern 110 to act as a light-emitting region.

FIG. 3B is a top plan view showing the surface geometry of the p-GaAs processed layer 108 which is the uppermost layer in the layered structure 100a. In the surface of the processed layer 108, there is formed a recessed structure 120, which extends along a light-emitting stripe axis 130, having the pattern shown in FIG. 3B as the cross-sectional shape taken parallel to the base layer. The length of the semiconductor laser device 100 is 250 μm. The recessed structure 120 has a width of 100 μm in a region 121 extending over a distance of 100 μm from a laser light emitting facet 111 along the longitudinal direction of the device 100, and a width of 30 μm in a region 122 extending over a distance of 100 μm from the opposite facet 112 of the device 100 along the longitudinal direction thereof. These two regions 121 and 122 are separated by a trapezoidally shaped intermediate region 123 interposed between them.

The above semiconductor laser device 100 is fabricated in the following sequence.

First, a wafer having the layered structure 100a from the n-GaAs layer 101 in the lowermost layer to the p-GaAs processed layer 108 in the uppermost layer, from which the semiconductor laser devices to be fabricated, is provided using ordinary photolithography and MOCVD (metal-organic chemical vapor deposition) crystal growth techniques.

Next, a photoresist corresponding to the pattern shown in FIG. 3B is formed over a plurality of designated regions on the surface of the p-GaAs processed layer 108 on the wafer. With this photoresist as a mask, the p-GaAs layer 108 is selectively etched using an ammonium-based etching solution. Since $Al_xGa_{1-x}As$ (0.4<x) is virtually resistant to ammonium-based etching solutions, the etching stops at the p-$Al_{0.45}Ga_{0.55}As$ etching stop layer 107 lying under the p-GaAs processed layer 108.

Then, the p-$Al_{0.45}Ga_{0.55}As$ etching stop layer 107 is selectively removed by etching with a hydrofluoric acid-based etching solution.

The depth of the recessed structure 120 is typically 1.05 μm. The recessed structure 120 also has tapered sidewalls sloping down in the depth direction at a prescribed angle, as shown in FIG. 3A. Accordingly, the surface 120' of the p-$Al_{0.45}Ga_{0.55}As$ etching stop layer 107 exposed by the etching of the p-GaAs processed layer 108 has a pattern identical to that of the recessed structure 120 formed in the p-GaAs processed layer 108, except that the width is smaller.

An ohmic electrode (not shown) is formed on each semiconductor laser device 100 thus fabricated, and on top of it, a mounting electrode (a mounting metal layer) 109 consisting of a 50 nm thick Mo layer and a 0.2 μm thick Au layer is deposited.

Next, the structure of an optical integrated circuit substrate 150 will be described below.

FIG. 3C is a top plan view of a wafer 195 on which the optical integrated circuit substrates 150 are fabricated. Regions 160 where the semiconductor laser devices are to be mounted are formed in a matrix array on the surface of the wafer 195.

Figure 3D:
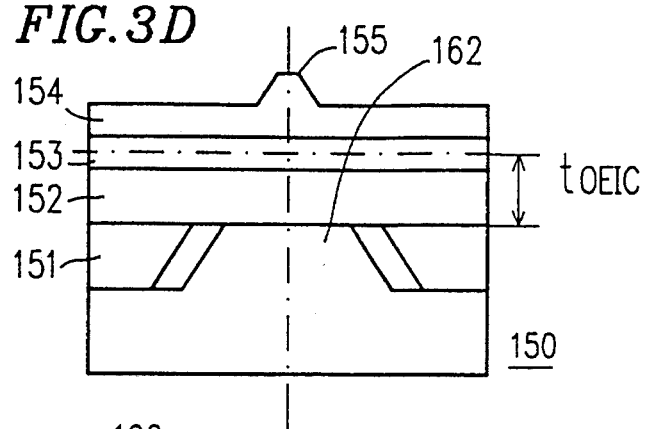
Figure 3E:
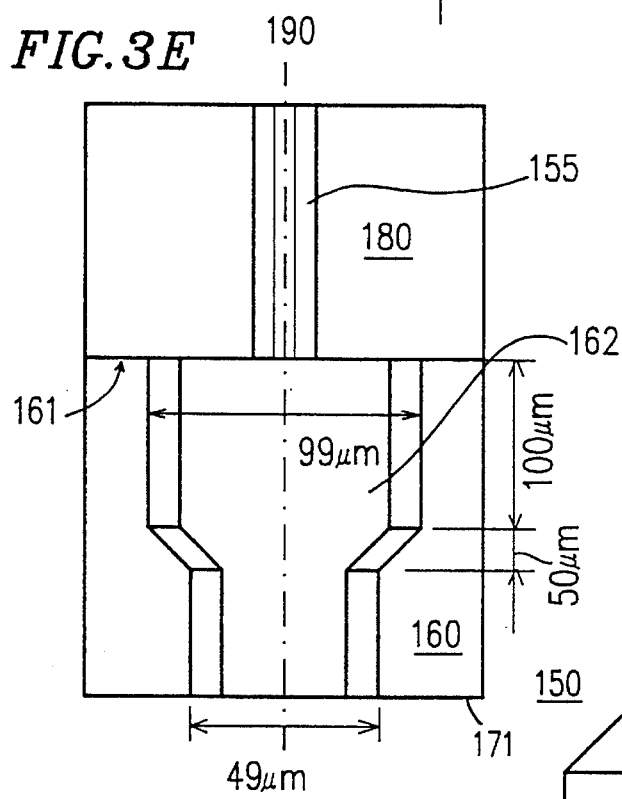

FIG. 3D is a front view of an optical integrated circuit substrate 150 separated in the form of an individual chip from the wafer 195, and FIG. 3E is a top plan view of the optical integrated circuit substrate 150. As shown in FIG. 3D, the optical integrated circuit substrate 150 has a first cladding layer 152 of $SiO_2$ (silicon dioxide), a core layer 153 of $Si_3N_4$ (silicon nitride), and a second cladding layer 154 of $SiO_2$, formed in this order on an Si substrate 151 that serves as a base.

This optical integrated circuit substrate 150 is fabricated in the following sequence.

First, the $SiO_2$ first cladding layer 152 of 3.6 μm thickness, the $Si_3N_4$ core layer 153 of 0.3 μm thickness, and the $SiO_2$ second cladding layer 154 of 1.6 μm thickness, are successively formed in identical face geometry in this order on the surface of the Si substrate 151. A high-frequency sputtering method, for example, may be used to form these layers.

Next, a semiconductor laser mounting region 160 having the geometry shown in FIG. 3E is formed using ordinary photolithography and reactive ion etching (RIE) techniques in the following manner.

First, the second cladding layer 154, the core layer 153, and the first cladding layer 152 are removed over the region 160 longer than the length of the semiconductor laser device 100 to be mounted as measured in longitudinal direction from one facet 171 of the device. Thus, the surface of the lowermost Si substrate 151 is exposed in the region 160, leaving a waveguide region 180 unetched.

In this etching process, the amount of etching (etching depth) can be detected by analyzing the atomic species contained in the gas being emitted during the etching. The amount of etching (etching depth) can also be detected by spectrum analysis of the plasma state of the etching gas. By detecting the etching depth using such techniques, the surface of the Si substrate 151 can be exposed with good accuracy. Also, it is desirable that the etching conditions be selected so that the waveguide facet 161 formed by the etching is flat and also perpendicular to the exposed surface of the Si substrate 151.

Next, the second cladding layer 154 in the waveguide region 180 and the Si substrate 151 in the region 160 are processed simultaneously to form raised structures 155 and 162, respectively. The raised structures 155 and 162 are formed so that their center lines lie in the same plane perpendicular to the substrate.

The raised structure 155 formed in the waveguide region 180 defines the waveguide. This raised structure 155 is formed directly above the region defining the waveguide axis, and has a trapezoidal cross section with a maximum width of 7 μm and height of 1.2 μm. Because of the presence of this raised structure 155, the effective refractive index for the light passing through the core layer 153 is the highest directly below the raised structure 155, thus serving to guide the light. Hence, the raised structure 155 defines the waveguide.

On the other hand, the raised structure 162, of 1.2 μm high, is formed in the region 160 where the semiconductor laser device is to be secured. The raised structure 162, which extends along a waveguide axis 190, has a shape that matches the shape of the recessed structure 120 formed in the surface of the semiconductor laser device 100. The semiconductor laser device 100 is mounted on the optical integrated circuit substrate 150 with the recessed structure 120 fitting onto the raised structure 162.

The recessed structure 120 and the raised structure 162 are formed by photolithography using masks having a pattern that matches the respective cross-sectional shapes but is reversed from each other. In the etching process, because of the side etching effect, the recessed structure 120 is formed wider and the raised structure 162 narrower than the respective mask patterns. The raised structure 162 is formed to have a width of 99 μm in the region extending over a distance of 100 μm in longitudinal direction from the light input facet 161. The width gradually becomes narrower in an adjacent region over a distance of the next 50 μm, and the width is 49 μm in the remaining region extending to the opposite facet 171. The longitudinal dimension of the raised structure 162 is chosen to be about 1 mm longer than the length, 250 μm, of the semiconductor laser device 100 so that the semiconductor laser device 100 can be moved stably along the raised structure 162 when mounted on the optical integrated circuit substrate 150.

Next, an Au/Zn layer (not shown) to be used for mounting is deposited to a thickness of 1.0 μm to cover the raised structure 162. In the deposition, there is a possibility that the Au/Zn layer is formed extending over the waveguide region 180. Such an Au/Zn mounting metal layer over the waveguide region 180, if left unremoved, could lead to errors in fitting the recessed structure 120 onto the raised structure 162 in the subsequent step; therefore, it is desirable that such an unwanted portion of the mounting metal layer be removed by photolithography after deposition.

Figure 3F:
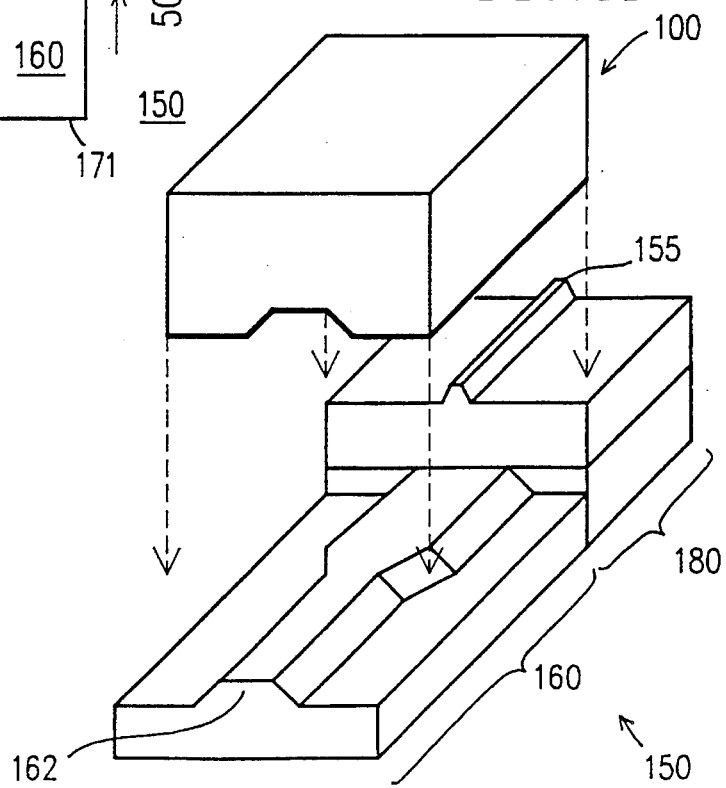

The recessed structure 120 of the semiconductor laser device 100 and the raised structure 162 of the optical integrated circuit substrate 150 are then placed opposite to each other, as shown in FIG. 3F, before bonding them together. In this process, the semiconductor laser device 100 is first placed at a position appropriately spaced apart in longitudinal direction from the light input facet 161 of the optical integrated circuit substrate 150. Then, the semiconductor laser device 100 is moved toward the light input facet 161 along the longitudinal direction of the optical integrated circuit substrate 150 until the recessed structure 120 of the semiconductor laser device 100 is fitted onto the raised structure 162 of the optical integrated circuit substrate 150 with their tapered portions firmly contacting each other. By this simple mechanical movement of the semiconductor laser device 100, the light-emitting facet 111 of the semiconductor laser device 100 can be positioned with a spacing of about 10 μm from the light input facet 161 of the optical integrated circuit substrate 150.

It is desirable that the light-emitting facet 111 of the semiconductor laser device 100 and the light input facet 161 of the optical integrated circuit substrate 150 be brought as close to each other as possible along the direction of the waveguide, for the following reason.

Laser light emitted from the semiconductor laser device 100 spreads out at a certain angle. On the other hand, of the light input facet 161 of the optical integrated circuit substrate 150, the part that effectively contributes to optical coupling is limited in area. Therefore, as the spacing between the facets 111 and 161 increases and the spreading of the laser light becomes larger, the power density of the laser light coupled to the effective part of the light input facet 161 decreases. If the spacing between the facets 111 and 161 is set at 30 μm or less, a coupling efficiency of 3% or more, which is a practical value, can be obtained for optically coupling between the light-emitting stripe axis 130 of the semiconductor laser device 100 and the waveguide axis 190 of the optical integrated circuit substrate 150.

In the present example, the spacing between the laser light emitting facet 111 and the laser light input facet 161 can be set at 10 μm which is much smaller than the above critical value of 30 μm. Moreover, it is possible to further reduce the spacing, for example, by decreasing the taper angle of the recessed structure 120 and the raised structure 162, or by reducing the thickness of the mounting metal layer to be used for mounting.

After the semiconductor laser device 100 has been moved to the prescribed position, the optical integrated circuit substrate 150 is heated while applying a pressure of about 30 g to the semiconductor laser device 100 from the n-GaAs substrate 101 side thereof. In this heating process, the Au layer on the surface of the semiconductor laser device 100 is alloyed with the Au/Zn layer on the semiconductor laser device mounting region 160 of the optical integrated circuit substrate 150, and the two devices are bonded together. In the present example, the two devices are heated to 350° C. and held in this state for about 10 seconds.

For the thus fabricated optical integrated circuit device, the mounting accuracy required in butt-coupling the waveguiding layers is evaluated. More specifically, the displacement between the light-emitting stripe axis 130 of the active layer 103 in the semiconductor laser device 100 and the waveguide axis 190 of the core layer 153 in the optical integrated circuit substrate 150 is measured along a plane perpendicular to the layers. The thus measured value is evaluated using the following formula (1).

$$|t_{LD}+t_{METAL}-t_{OEIC}| \quad (1)$$

where $t_{LD}$ is the distance in the semiconductor laser device 100 from the bottom surface of the recessed structure 120 to the light-emitting stripe axis of the active layer 103 (i.e., the sum of half the thickness of the active layer 103, the thickness of the p-type cladding layer 104, and the thickness of the p-type first contact layer 106, see FIG. 3A), $t_{OEIC}$ is the distance in the optical integrated circuit substrate 150 from the top surface of the raised structure 162 to the waveguide axis 190 of the core layer 153 (i.e., the sum of the thickness of the $SiO_2$ first cladding layer 152 and half the thickness of the $Si_3N_4$ core layer 153, see FIG. 3D), and $t_{METAL}$ is the total thickness of the mounting metal layers in both the semiconductor laser device 100 and the optical integrated circuit substrate 150 (not shown in the figures).

In the optical integrated circuit device of the present example, the above dimensions are typically as follows: $t_{LD}$=2.54 μm; $t_{OEIC}$=3.75 μm; $t_{METAL}$= 1.25 μm.

When these dimensions are substituted into formula (1) for evaluation of the mounting accuracy, a value of 0.04 μm is obtained. This indicates that the optical integrated circuit device of the present example satisfies the mounting accuracy of 0.5 μm, in the direction perpendicular to the layers, required in butt-coupling the waveguiding layers of the semiconductor laser device 100 and the optical integrated circuit substrate 150.

In the present example, the recessed structure 120, extending along the light-emitting stripe axis 130, is formed symmetrical about the light-emitting stripe axis 130 of the active layer 103 in the direction parallel to the layers of the semiconductor laser device 100 and perpendicular to the light-emitting stripe axis 130. Furthermore, the recessed structure 120 has a tapered profile.

Likewise, the raised structure 162, extending along the waveguide axis 190, of the optical integrated circuit substrate 150, which corresponds to the recessed structure 120 of the semiconductor laser device 100, is formed so that its cross-sectional shape taken in parallel to the layers is symmetrical about the center line of the raised structure 155 (the waveguide axis 190) of the waveguide region 180.

With the construction detailed above, the semiconductor laser device 100 and the optical integrated circuit substrate 150 are formed by using a MOCVD process which has the ability to control layer thickness with an accuracy of 0.1 μm or less, and also by using a photolithographic or etching technique having fine profile processing accuracies of 1 μm or less. Thus, the accuracies of these layer deposition and profile processing techniques are reflected with good reproducibility in the positioning accuracies for the semiconductor laser device 100 and the optical integrated circuit substrate 150. As a result, by simple mechanical positioning, the light-emitting stripe axis 130 of the active layer 103 in the semiconductor laser device 100 can be brought into straight alignment with the waveguide axis 190 of the core layer 153 in the optical integrated circuit substrate 150.

Since the thickness of a layer formed by MOCVD usually has a deviation of only a few percent or less (±2%) throughout the layer, the above-described accuracy can also be satisfied over the entire surface of the wafer. This makes it possible to mount the semiconductor laser device 100 on the optical integrated circuit substrate 150 being still in the wafer form, as shown in FIG. 3C; this can be done without monitoring the actual optical coupling intensity as in the prior art method. This greatly reduces the time and the number of processing steps required for fabricating the optical integrated circuit device, and therefore leads to a dramatic improvement in mass production efficiency.

Furthermore, since the semiconductor laser device 100 need not be driven to emit light when mounted onto the optical integrated circuit substrate 150, there is no concern of degradation of the semiconductor laser device 100 during the fabrication of the optical integrated circuit device, and the fabrication yield can be improved dramatically.

In addition, to ensure the stable light-emitting operation of the semiconductor laser device 100 in the completed optical integrated circuit device, the heat generated near the active layer 103 must be dissipated efficiently. To achieve this, it is desirable that the semiconductor laser device 100 be placed in intimate contact with a flat heat sinking surface over a width several to 10 times the laser stripe width (usually 10 μm or less).

In the present example, the 50 μm wide region, symmetrical about the light-emitting stripe axis, in the bottom of the recessed structure 120 of the semiconductor laser device 100, has a high degree of surface flatness. In addition, to ensure proper contact, the height (1.2 μm) of the raised structure 162 of the optical integrated circuit substrate 150 is made greater than the depth (1.05 μm) of the recessed structure 120 of the semiconductor laser device 100. This serves to enhance the close contact between the bottom of the recessed structure 120 of the semiconductor laser device 100 and the top surface of the raised structure 162 of the optical integrated circuit substrate 150.

As a result, the heat generated in the semiconductor laser device 100 is efficiently transferred to the Si substrate 151 of the optical integrated circuit substrate 150. This suppresses detrimental effects on the lifetime, threshold current, light-emitting efficiency, and other characteristics of the semiconductor laser device 100.

With the above-described configuration, according to the invention, when the recessed/raised structures 120 and 162, both extending along the optical axes, are fitted one onto the other, the tapered cross section of each recessed/raised structure serves to guide the other recessed/raised structure in the prescribed direction. Therefore, when these recessed/raised structures are formed with the processing accuracy required to achieve alignment in butt-coupling the optical waveguide devices, the fine profile processing accuracy incorporated into the recessed/raised structures can be reflected with good reproducibility in the positioning accuracy. At the same time, it is made easy to bring the light-emitting stripe axis 130 of the semiconductor laser device 100 into straight alignment with the waveguide axis 190 of the optical integrated circuit substrate 150.

EXAMPLE 2

A second example of the invention will be described below. In the first example, the recessed structure is formed on the semiconductor laser device; in the second example, on the other hand, the recessed structure is formed on the optical integrated circuit substrate while the raised structure is formed on the semiconductor laser device.

First, a semiconductor laser device in chip form will be described. FIG. 4 is a perspective view illustrating a semiconductor laser device 200 and an optical integrated circuit substrate 250, according to the second example.

In the semiconductor laser device 200, a p-AlGaAs cladding layer 202 is formed to a thickness of 1.2 μm over the entire surface of a p-GaAs substrate 201 that serves as a base. On top of the cladding layer 202 are formed a p-AlGaAs active layer 203 of 0.05 μm thickness, an n-AlGaAs cladding layer 204 of 1.3 μm thickness, a GaAs current blocking layer 205 of 1.0 μm thickness, and a GaAs contact layer 206 of 1.0 μm thickness; these layers, with identical surface geometry, are formed one on top of another in the order stated. The active layer 203 has a 5 μm wide light-emitting stripe. The length of the device 200 is 300 μm.

The GaAs contact layer 206 has a raised structure 221. The raised structure 221, extending along an optical axis (a light-emitting stripe axis), has a trapezoidal cross section that is symmetrical about the optical axis of the active layer 203; the width of an facet 212 corresponding to the longer side of the trapezoid is 249 μm, and the width of a light-emitting facet 211 corresponding to the shorter side of the trapezoid is 29 μm. The raised structure 221 is 0.9 μm in height, and both sides of the raised structure 221 are tapered at a prescribed angle.

A 50 nm thick Ti layer and a 250 nm thick Au layer (these layers not shown) are deposited, as a mounting metal layer, on the surface of the raised structure 221 of the thus fabricated semiconductor laser device 200.

On the other hand, the optical integrated circuit substrate 250 is fabricated by forming, on top of an Si substrate 251, an SiO$_2$ first cladding layer 252 of 3.1 μm thickness, an SiON second cladding layer 253 of 0.4 μm thickness, an Si$_3$N$_4$ core layer 254 of 0.15 μm thickness, an SiON third cladding layer 255 of 0.4 μm thickness, and an SiO$_2$ fourth cladding layer 256 of 1.0 μm thickness, one on top of another in this order by using a plasma chemical vapor deposition (PCVD) method. Next, a region reaching 4.25 μm deep below the surface of the SiO$_2$ fourth cladding layer 256 and extending 1000 μm along the longitudinal direction of the surface is etched away by ion milling. The unetched portion is a waveguide region 280, while the portion where the surface is exposed by etching is a semiconductor laser device mounting region 260. In this process, it is desirable that the etching conditions be selected so that the light input facet 261 of the waveguide region 280 is formed substantially perpendicular to the exposed surface of the semiconductor laser device mounting region 260.

Next, a recessed structure 262 is formed in the semiconductor laser device mounting region 260 by using photolithography and wet etching techniques. The recessed structure 262, extending along a waveguide axis 290, has a shape that matches the shape of the raised structure 221 formed on the semiconductor laser device 200. The line of symmetry running through the recessed structure 262 in the direction parallel to the layers is aligned with the direction of propagation of the light. The depth of the recessed structure 262 is 0.8 μm, and in its bottom, the surface of the Si substrate 251 is exposed.

In the same process for forming the recessed structure 262, air venting grooves 263 each having a width of about 20 μm are formed at 100 μm pitch in the remaining portions of the semiconductor laser device mounting region 260 except the portions thereof forming the recessed structure 262. These grooves 263 are provided to prevent air bubbles from being trapped in the area directly below the light-emitting stripe 210 when the semiconductor laser device 200 is fitted onto the optical integrated circuit substrate 250. Such an entrapment of the air bubbles would prevent the heat generated during the energization of the semiconductor laser device 200 from being effectively transferred to the Si substrate 251.

A 50 nm thick Au layer and a 1 μm thick In layer (not shown) are deposited, as a mounting metal layer, over the surface of the optical integrated circuit substrate 250.

The raised structure 221 of the semiconductor laser device 200 and the recessed structure 262 of the optical integrated circuit substrate 250 are then placed opposite each other, as shown in FIG. 4, before bonding them together.

In this process, the semiconductor laser device 200 is first placed at a position appropriately spaced apart in the longitudinal direction from the light input facet 261 of the optical integrated circuit substrate 250. Then, the semiconductor laser device 200 is moved toward the light input facet 261 along the longitudinal direction of the optical integrated circuit substrate 250 until the raised structure 221 is fitted into the recessed structure 262 with their tapered portions firmly contacting each other. With this simple mechanical movement of the semiconductor laser device 200, the light-emitting facet 211 of the semiconductor laser device 200 can be positioned with a spacing of about 10 μm from the light input facet 261 of the optical integrated circuit substrate 250. As described in the first example, this spacing satisfies the critical value of 30 μm required to obtain the specified optical coupling efficiency.

Next, while applying a load of 15 g to the semiconductor laser device 200 from the Si substrate 201 side thereof, the optical integrated circuit substrate 250 is heated to 280° C. and is held at that temperature for about 15 seconds. In this pressing/heating process, the Au layer on the semiconductor layer device 200 is alloyed with the In layer on the optical integrated circuit substrate 250, thus bonding the semiconductor laser device 200 to the optical integrated circuit substrate 250.

The mounting accuracy for the thus fabricated optical integrated circuit device was evaluated, as in the first example. In the second example, typical values were $t_{LD}$=2.33 μm for the distance in the semiconductor laser device 200 between the light-emitting stripe axis 230 and the recessed/raised structure, $t_{OEIC}$=3.58 μm for the distance in the optical integrated circuit substrate 250 between the waveguide axis 290 of the waveguide region and the recessed/raised structure, and $t_{METAL}$=1.25 μm for the total thickness of the mounting metal layers in both devices 200 and 250. Substitution of these values into formula (1) yields $|t_{LD}+t_{METAL}-t_{OEIC}|$=0 μm. Therefore, the second example also satisfies one of the mounting accuracy parameters required in butt-coupling the waveguiding layers; that is, the displacement between the light-emitting stripe axis 230 of the semiconductor laser device 200 and the waveguide axis 290 of the optical integrated circuit substrate 250, in a plane perpendicular to the layers and parallel to the waveguide axis 290, should be kept within 0.5 µm.

Furthermore, the alignment in the directions parallel to the layers and perpendicular to the light-emitting stripe axis 230 (or the waveguide axis 290) is defined by the taper structure symmetrical about the light-emitting stripe axis 230 (or the waveguide axis 290). In this case also, the mounting accuracy of ±0.5 µm can be obtained.

As described above, in the second example also, by simple mechanical positioning, the semiconductor laser device 200 can be mounted onto the optical integrated circuit substrate 250 with a mounting accuracy that satisfies the specified coupling efficiency. Therefore, the semiconductor laser device 200 can be mounted on the optical integrated circuit substrate 250 as being still in wafer form. This achieves a dramatic improvement in the mass production efficiency of the optical integrated circuit device.

EXAMPLE 3

A third example of the invention will be described below.

Figure 5:
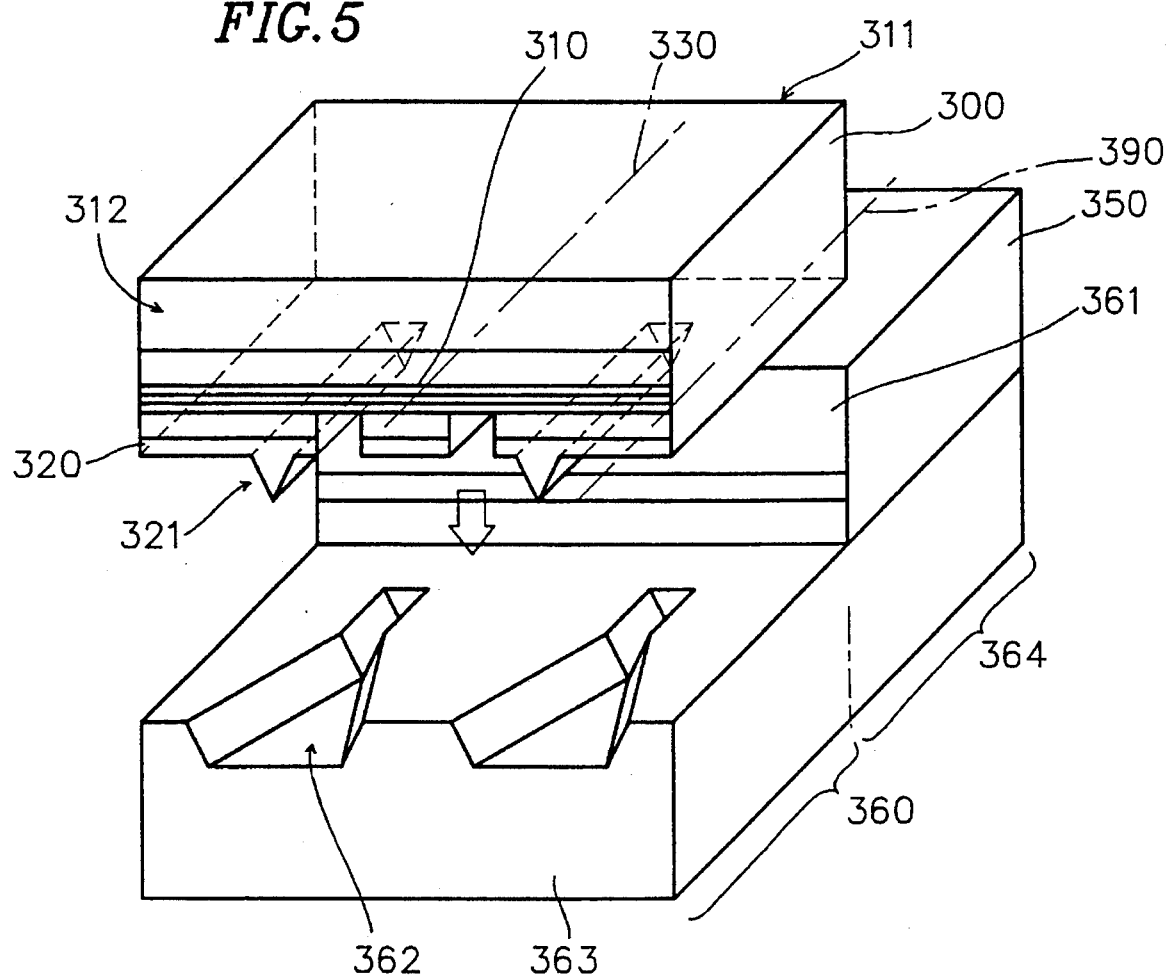
FIG. 5 is a diagram illustrating an assembly structure in accordance with a third example of the invention.

FIG. 5 is a perspective view showing a semiconductor laser device 300 and an optical integrated circuit substrate 350, according to the third example. In the third example, raised structures 321 are formed on the semiconductor laser device 300, while recessed structures 362 are formed on the optical integrated circuit substrate 350.

The semiconductor laser device 300 described in the third example is an ordinary ridge-waveguide device which has a laser stripe. The details of the device structure will not be given here. The following description deals with the raised structures 321 formed on the semiconductor laser device 300 and the recessed structures 362 formed on the optical integrated circuit substrate 350.

As shown in FIG. 5, on the surface of a contact layer 320 in the semiconductor laser device 300, there are formed the raised structures 321 extending parallel to the light-emitting stripe axis 330 of an active layer 310. Thus, the respective raised structures 321 are along lines spaced apart by 140 µm and symmetric to each other with respect to the light-emitting stripe axis 330. Each of the raised structures 321 has a shape of an isosceles triangle, with a 2.0 µm height and a 5 µm base length, in cross section taken along a plane perpendicular to the light-emitting stripe axis 330. Each raised structure 321 is formed starting at a position 20 µm from a light-emitting facet 311, extending in the longitudinal direction of the device 300, and terminating at the rear facet 312.

In the third example, as in the first example, a plurality of optical integrated circuit substrates are fabricated on a wafer, and a plurality of semiconductor laser device mounting regions 360 are formed by photolithography and etching. As in the foregoing examples, unetched regions are left, which are waveguide regions 364. In the etching process, it is desirable to use an etching pattern that does not form the semiconductor laser device mounting regions 360 in a discrete manner. This is necessary to retain uniformity in the photoresist, to be used for pattern forming, over the entire area.

Next, two recessed structures 362 that respectively correspond to the raised structures 321 of the semiconductor laser device 300 are formed in each of the semiconductor laser device mounting regions 360 on the wafer by ordinary photolithography and etching. These two recessed structures 362 are formed along lines extending parallel to the waveguide axis 390 and spaced apart by 140 µm and symmetric to each other with respect to the waveguide axis 390, each structure starting at a position 20 µm from a light input facet 361 and terminating at the rear facet 363.

Each recessed structure 362 has a V-shaped groove formed from the start position to a position 150 µm from the light input facet 361; the V-shaped groove has a cross-sectional shape resembling an inverted isosceles triangle with a base length of 5.5 µm and a height of 2.0 µm. Continuously with the V-shaped groove, there is formed a groove starting at a position 150 µm from the light input facet 361 and terminating at the rear facet 363; the cross-sectional shape of the groove taken along a plane parallel to the layers resembles a fan spreading out toward the rear facet 363. The cross section of this fan-shaped groove taken in a plane perpendicular to the waveguide axis 390 is of the shape of an isosceles trapezoid 2.0 µm high and respectively symmetrical about the center line of the V-shaped groove.

The start position of each recessed structure 362 is spaced 20 µm from the light input facet 361 for the following reason. It is difficult to form a photoresist uniformly near the light input facet 361. This would cause the width of the V-shaped groove of the recessed structure 362 to be reduced near the light input facet 361. As a result, the raised structures 321 may not fit into the V-shaped grooves of the recessed structures 362 with the desired accuracy when securing the semiconductor laser device 300 in place. To prevent this, the recessed structures 362 are formed appropriately spaced apart from the light input facet 361.

Next, as in the foregoing examples, an Au-based conductive layer (not shown) for mounting is formed over the entire surface on the raised structure side of the semiconductor laser device 300 as well as over the entire surface of the semiconductor laser device mounting region 360.

After that, as shown in FIG. 5, the semiconductor laser device 300 is placed in intimate contact with the optical integrated circuit substrate 350 with their raised structures 321 and the recessed structures 362 fitting each other. In this process, the semiconductor laser device 300 is first placed with its light-emitting facet 311 positioned at least 200 µm apart from the light input facet 361 of the optical integrated circuit substrate 350. From this position, the semiconductor laser device 300 is gradually moved toward the light input facet 361.

The two raised structures 321 of the semiconductor laser device 300 are formed along lines symmetric to each other with respect to the light-emitting stripe axis 330 of the active layer 310, each raised structure having a cross-sectional shape symmetrical about its associated line. Likewise, the two recessed structures 362 of the optical integrated circuit substrate 350 are formed along lines symmetric to each other with respect to the waveguide axis 390. The cross section of each recessed structure has tapered walls symmetric to each other with respect to its associated line, each tapered wall forming a prescribed angle with respect to a direction parallel to the waveguide axis 390.

With the above construction, in the third example also, the raised structures 321 and the recessed structures 362, respectively formed on the semiconductor laser device 300 and the optical integrated circuit substrate 350, serve as guides with respect to each other. Therefore, by slightly moving them, the light-emitting stripe axis 330 can be brought into straight alignment with the waveguide axis 390, ensuring good contact between the two facets 311 and 361.

Thus, by simple mechanical movement, the laser device 300 can be secured to the optical integrated circuit substrate 350 with the laser light emitting facet 311 firmly contacting the laser light input facet 361. The mounting accuracy in the direction parallel to the layers and perpendicular to the light-emitting stripe axis 330 is within the range of ±0.5 μm.

The mounting accuracy in the direction perpendicular to the layers is evaluated using formula (1), as in the foregoing examples, on the basis of the distance $t_{LD}$, the distance $t_{OEIC}$, and the sum $t_{METAL}$. The third example also satisfies the relation $|t_{LD}+t_{METAL}-t_{OEIC}|<0.5$ μm.

Finally, the optical integrated circuit substrate 350 is heated to alloy the mounting metal layers respectively deposited on the raised structures 321 and the recessed structures 362, thus bonding the semiconductor laser device 300 to the optical integrated circuit substrate 350. In the third example, the two devices 300 and 350 are heated to 300° C. and held at that temperature for about 15 seconds.

Thus, in the third example also, the productivity of the optical integrated circuit device can be increased while improving the device fabrication yield. Furthermore, since the mounting faces of the semiconductor laser device 300 excluding the raised structures 321 maintain good contact with the faces of the semiconductor laser mounting region 360 of the optical integrated circuit substrate 350 excluding the recessed structures 362, the heat generated in the laser stripe 310 can be effectively transferred to the optical integrated circuit substrate 350. This ensures sufficient reliability of the semiconductor laser device 300 in terms of heat dissipation.

EXAMPLE 4

Figure 6A:
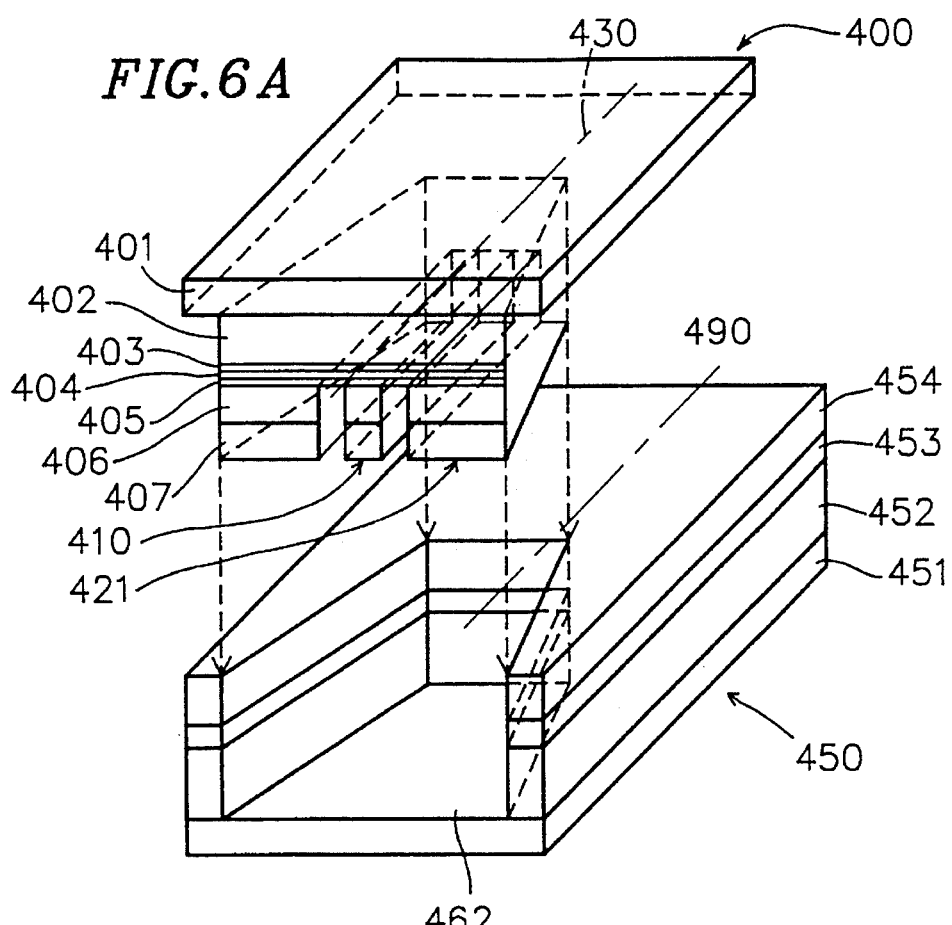
FIGS. 6A–6C are diagrams illustrating an assembly structure in accordance with a fourth example of the invention.

A fourth example of the invention will be described below. FIG. 6A is a perspective view showing the structure of a semiconductor laser device 400 and an optical integrated circuit substrate 450 according to the fourth example.

The semiconductor laser device 400 has an n-InP substrate 401 that serves as a base, on the surface of which a 1.0 μm thick cladding layer 402 of n-InP, a 0.12 μm thick guide layer 403 of n-InGaAsP (corresponding to a wavelength of 1.15 μm), a 0.035 μm thick active layer 404 of InGaAsP (corresponding to a wavelength of 1.3 μm), a 0.12 μm thick guide layer 405 of p-InGaAsP (corresponding to a wavelength of 1.15 μm), a 1.0 μm thick cladding layer 406 of p-InP, and a 0.5 μm thick contact layer 407 of InGaAs are formed in identical surface geometry in this order by MOCVD.

Further, two grooves, each 10 μm wide and 1.5 μm deep through the two layers of the p-InGaAs contact layer 407 and the p-InP cladding layer 406, are formed along lines symmetric to each other with respect to the light-emitting stripe axis 430. These two grooves are formed, first by selectively etching the p-InGaAs contact layer 407 with a sulfuric acid-based etching solution, and then by selectively etching the p-InP cladding layer 406 with a hydrochloric acid-based etching solution.

Figure 6B:
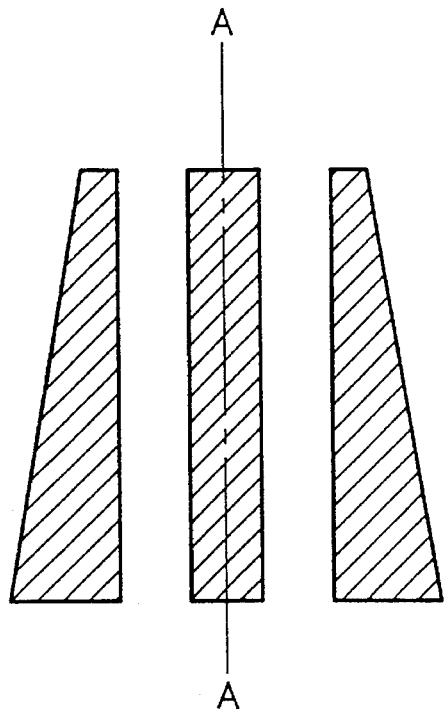

Next, using ordinary photolithography and reactive ion beam etching (RIBE) techniques, a raised structure 421, extending along a light-emitting stripe axis 430, is formed working from the p-InGaAs contact layer 407 side and reaching down through the n-InP cladding layer 402. The cross section of the raised structure 421 taken along a plane parallel to the layers is trapezoidal in shape symmetrical with respect to the light-emitting stripe axis 430 of the active layer 404. FIG. 6B shows the mask pattern for the raised structure 421 and the grooves formed in the raised structure 421. The raised structure 421 is typically 2.5 μm high.

Next, an insulating layer of $SiO_2$ (not shown) is formed over the entire surface on the raised structure 421 side of the semiconductor laser device 400. Finally, the insulating layer on the surface of the p-InGaAs contact layer 407 is removed, and a current injection electrode (not shown) is formed on the exposed surface.

On the other hand, the optical integrated circuit substrate 450 includes an Si substrate 451 as a base. On the surface of the Si substrate 451, a 2.0 μm thick first cladding layer 452 of $SiO_2$, a 0.2 μm thick core layer 453 of $Si_3N_4$, and a 0.8 μm thick second cladding layer 454 of $SiO_2$ are successively formed in identical surface geometry in this order by using a PCVD technique.

Next, using ordinary photolithography and reactive ion etching (RIE) techniques, a recessed structure 462 having a shape to match the raised structure 421 of the semiconductor laser device 400 is formed working from the $SiO_2$ second cladding layer 454 side and reaching down through the $SiO_2$ first cladding layer 452. The depth of the recessed structure 462 is 3.0 μm which is equal to the summed thickness of the $SiO_2$ first cladding layer 452, the $Si_3N_4$ core layer 453, and the $SiO_2$ second cladding layer 454. Thus, the surface of the Si substrate 451 is exposed at the bottom.

Thereafter, mounting electrodes, in other words, mounting metal layers (not shown) are formed on the top surfaces of the raised structure 421 of the semiconductor laser device 400 and also on the bottom surface of the recessed structure 462 of the optical integrated circuit substrate 450.

To couple the raised structure 421 to the recessed structure 462, the semiconductor laser device 400 is first fitted onto the optical integrated circuit substrate 450 in contacting relationship with each other; then, the two devices 400 and 450 are heated to a temperature at which the mounting metal layers on both devices 400 and 450 react with each other, and the semiconductor laser device 400 is secured to the optical integrated circuit substrate 450. In the fourth example, the two devices are heated to 320° C. and held at that temperature for about 30 seconds.

In the first to third examples, the semiconductor laser device mounting region is formed first, and then a raised structure or recessed structure is formed in that region. On the other hand, according to the above-described construction of the fourth example, the recessed structure 462 for mounting the semiconductor laser device 400 can be formed in a single etching step after forming the optical integrated circuit substrate 450. This serves to reduce the number of processing steps and the number of masks required and thereby increase the production efficiency. This also serves to prevent the accumulation of processing errors.

The mounting accuracy for the optical integrated circuit device fabricated according to the fourth example is evaluated using formula (1) as in the foregoing examples. Typical values are $t_{LD}=1.64$ μm, $t_{OEIC}=2.1$ μm, and $t_{METAL}=0.5$ μm. Substitution of these values into formula (1) yields $|t_{LD}+t_{METAL}-t_{OEIC}|=0.04$ μm. As in the foregoing examples, this result satisfies the critical value of ±0.5 μm, the specified mounting accuracy in the direction perpendicular to the layers.

On the other hand, the mounting accuracy in the direction parallel to the layers and perpendicular to the waveguide axis 490 is ±0.3 μm (critical value is ±0.5 μm). Furthermore, the spacing between the laser light emitting facet of the semiconductor laser device 400 and the light input facet of the optical integrated circuit substrate 450, as measured in the direction of the waveguide axis 490, can be made as close as about 2 µm (critical value is 30 µm).

The fourth example thus satisfies the prescribed mounting accuracies.

Figure 6C:
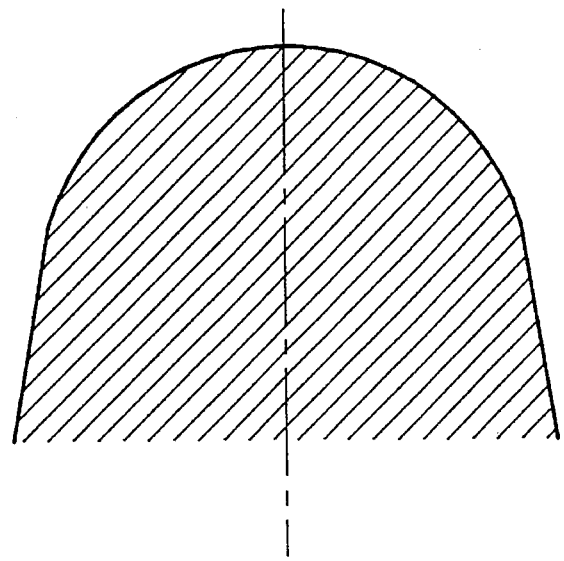

In this invention, the cross-sectional shapes of the recessed/raised structures taken along a plane parallel to the layers are not limited to those illustrated in the foregoing examples. Alternatively, the structures may be formed in a suitable shape, as long as the shape is symmetrical about the optical axis, such as the light-emitting axis or the waveguide axis, the structures are extending along the optical axes and part of its contour is tapered to provide a guide for mounting. FIG. 6C shows another example of the cross-sectional shape of the recessed/raised structures taken along a plane parallel to the layers. As shown, the taper on the cross section may be, for example, parabolic or hyperbolic having an axially spreading pattern, as long as it serves a guiding function.

EXAMPLE 5

A fifth example will be described below which concerns an assembly structure that can easily achieve prescribed positioning accuracy in a direction perpendicular to the layers.

Figure 7A:
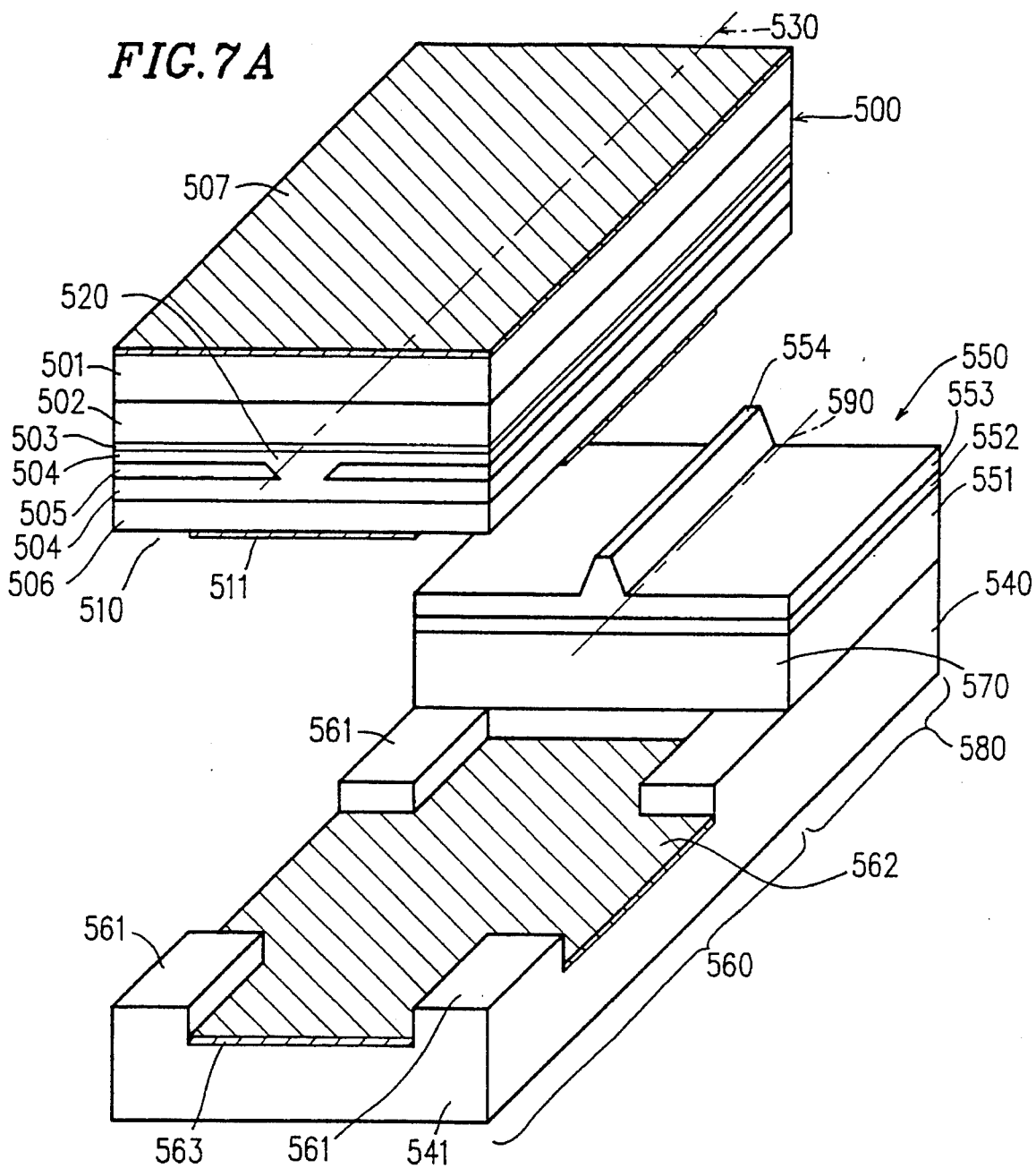
FIGS. 7A–7D are diagrams illustrating an assembly structure in accordance with a fifth example of the invention.
Figure 7B:
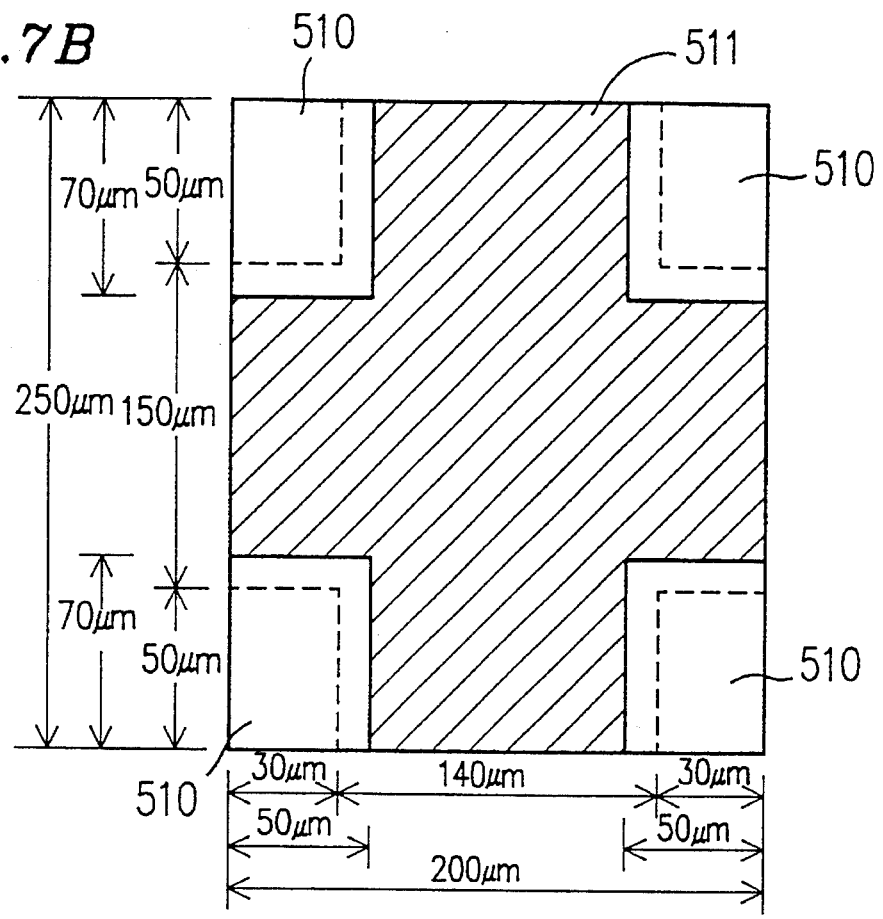

FIG. 7A is a perspective view showing a structure of a semiconductor laser device 500 and an optical integrated circuit substrate 550 according to the fifth example. FIG. 7B is a top plan view showing one surface (p-GaAs contact layer side to be described later) of the semiconductor laser device 500.

In the optical integrated circuit substrate 550, a recessed portion 562 and raised portions 561 are formed in the semiconductor laser device mounting region 560, as shown in FIG. 7A. The surfaces of the raised portions 561 provide touching faces which are brought into contact with corresponding touching faces 510 of the semiconductor laser device 500 shown in FIG. 7B; with these touching faces, dimensions in the direction perpendicular to the layers are controlled.

In the recessed portion 562, a filler material as an adhesive means is applied on a mounting electrode 563 formed over the recessed portion 562. The semiconductor laser device 500 is bonded to the optical integrated circuit substrate 550 by means of the filler material. The filler material does not make any contribution whatever to defining the dimensions in the direction perpendicular to the layers. The mounting accuracy in the direction perpendicular to the layers is defined solely by the processing accuracies of the surfaces of the raised portions 561 of the optical integrated circuit substrate 550 and the touching faces 510 of the semiconductor laser device 500.

On the other hand, the semiconductor laser device 500 described in the fifth example is an ordinary buried-stripe geometry semiconductor laser device fabricated through two MOCVD processing steps, but the invention is not limited to this type of laser device.

In the semiconductor laser device 500, an n-$Al_{0.5}Ga_{0.5}As$ cladding layer 502 is formed to a thickness of 1.2 µm over the entire surface of an n-GaAs substrate 501 that serves as a base. On top of the cladding layer 502 are formed a GaAs active layer 503 of 80 nm thickness, a p-$Al_{0.5}Ga_{0.5}As$ cladding layer 504 of 2.0 µm thickness, an n-GaAs current constricting layer 505 of 0.8 µm thickness, and a p-GaAs contact layer 506 of 0.5 µm thickness; these layers, with identical surface geometry, are formed one on top of another in the order stated. A portion of the n-GaAs current constricting layer 505 is removed in a stripe pattern to form a light-emitting region 520. A raised portion 511 having the cross-sectional shape shown by hatching in FIG. 7B is formed on the surface of the uppermost p-GaAs contact layer 506. This raised portion 511 is in fact a mounting electrode 511, and is formed by depositing a 50 nm thick Ti layer and a 250 nm thick Au layer in this order on the contact layer 506.

A fabrication method for the semiconductor laser device 500 will be described in further detail below.

First, using ordinary photolithography and MOCVD crystal growth techniques, a plurality of the semiconductor laser device 500, each having the layered structure from the n-GaAs substrate 501 in the lowermost layer to the p-GaAs contact layer 506 in the uppermost layer, are fabricated on a wafer. An ohmic electrode (not shown) is formed respectively on the surface of each of the n-GaAs substrate 501 and the p-GaAs contact layer 506. Next, a photoresist having a pattern corresponding to the mounting electrode 511 is formed to a thickness of 1 µm on the surface of the p-GaAs contact layer 506.

Then, using the resist pattern as a mask, a Ti layer and an Au layer, each with a thickness of 50 nm, are deposited one on top of the other to form the mounting electrode 511 on the surface of the p-GaAs contact layer 506. The four recessed portions shown in FIG. 7B, i.e., the portions where the mounting electrode 511 is not formed, are the touching faces 510 that are brought into contact with the optical integrated circuit substrate 550. The size of each touching face 510 is 50×70 µm, as shown in FIG. 7B, which is 20 µm longer and wider than the corresponding raised portion 561 of the optical integrated circuit substrate 550. The surface of each raised portion 561 of the optical integrated circuit substrate 550 measures 30×50 µm, as shown by dashed lines in FIG. 7B. The significance of such dimensioning will be explained later.

Next, an Al layer 507 as a mounting electrode is formed also on the n-GaAs substrate 501 of the semiconductor laser device 500. This Al layer 507 is deposited over the entire surface of the n-GaAs substrate 501. Finally, the semiconductor laser device 500 is completed by cleaving to form oscillation facets and by forming protective layers on the cleaved facets. The wafer is then separated into chips, thus obtaining the semiconductor laser device 500 in chip form.

The optical integrated circuit substrate 550 of the fifth example will now be described below.

The optical integrated circuit substrate 550 has, as shown in FIG. 7A, an Si substrate 540 that serves as a base, on the surface of which a first cladding layer 551 of $SiO_2$, a core layer 552 of $Si_3N_4$, and a second cladding layer 553 of $SiO_2$ are successively formed in this order. In this layered structure, the first cladding layer 551, the core layer 552, and the second cladding layer 553 are removed over a prescribed distance in a longitudinal direction from one longitudinal facet 541 of the device, as shown in FIG. 7A, leaving the Si substrate 540 exposed in that region. The region where the Si substrate 540 is exposed is the semiconductor laser device mounting region 560. The optical integrated circuit substrate 550 having the above structure is fabricated in the following sequence.

First, the $SiO_2$ first cladding layer 551 of 2.4 µm thickness, the $Si_3N_4$ core layer 552 of 0.3 µm thickness, and the $SiO_2$ second cladding layer 553 of 1.6 µm thickness are successively formed in identical surface geometry in this order on the surface of the Si substrate 540. Plasma CVD may be used to form these layers.

Next, the semiconductor laser device mounting region 560 having the geometry shown in FIG. 7B is formed in the following manner using ordinary photolithography and reactive ion etching (RIE) techniques. First, the second cladding layer 553, the core layer 552, and the first cladding layer 551 are removed over a region longer than the length of the semiconductor laser device 500, as measured from one longitudinal facet 541 of the device, to expose the surface of the underlying Si substrate 540. The exposed region is the semiconductor laser device mounting region 560, and the region left unetched is the waveguide region 580.

In this example also, the amount of etching (etching depth) can be detected by analyzing the atomic species contained in the gas being emitting during the etching. The amount of etching (etching depth) can also be detected by spectrum analysis of the plasma state of the etching gas. By detecting the etching depth using such techniques, the surface of the Si substrate 540 can be exposed with good accuracy. The etching conditions are selected so that the waveguide facet 570 formed by the etching is flat and perpendicular to the exposed surface of the Si substrate 540.

Next, the second cladding layer 553 in the waveguide region 580 and the Si substrate 540 in the semiconductor laser mounting region 560 are processed simultaneously to form a raised structure 554 and the raised portions 561, respectively. The raised structure 554 formed in the waveguide region 580 is trapezoidal in cross section, with a maximum width of 7 µm and a height of 1.0 µm. Similarly to the case of the optical integrated circuit substrate described in the first example, this raised structure defines the waveguide. The raised portions 561 formed in the four corners of the semiconductor laser device mounting region 560 are 1.0 µm high and provide areas to contact the semiconductor laser device 500.

Next, an Au layer as the mounting electrode 563 is deposited to a thickness of 50 nm over the surface of the recessed portion 562 in the semiconductor laser device mounting region, and on top of the Au layer, an In layer is deposited to a thickness of 1 µm. Excess electrode material deposited in the deposition process on other areas than the recessed portion 562, i.e., on the surfaces of the raised portions 561 and on the one facet face 570 of the optical waveguide region 580, are removed by photolithography.

Thereafter, individual optical integrated circuit substrates 550 fabricated on the wafer are separated by cleaving into individual chips, thus obtaining the optical integrated circuit substrate 550 in chip form.

The thus fabricated semiconductor laser device 500 and optical integrated circuit substrate 550 are bonded together in the following manner.

First, the semiconductor laser device 500 is placed in intimate contact with the In layer formed in the semiconductor laser device mounting region 560 of the optical integrated circuit substrate 550. In this condition, a pressure of about 15 g is applied to the semiconductor laser device 500 from the n-GaAs substrate 501 side thereof. With the pressure applied in this manner, the optical integrated circuit substrate 550 is heated up to 280° C. and is held at that temperature for about 15 seconds. In this process, the Au layer formed on the semiconductor laser device 500 is alloyed with the In layer formed on the optical integrated circuit substrate 550. The semiconductor laser device 500 and the optical integrated circuit substrate 550 are thus bonded together.

As previously noted, the surface of each of the four touching faces 510 of the semiconductor laser device 500 measures 50×70 µm. On the other hand, the size of each of the raised portions 561 of the optical integrated circuit substrate 550 corresponding to the touching faces 510 is 30×50 µm, which is 20 µm narrower and shorter than the corresponding touching faces 510 of the semiconductor laser device 500. This prevents excess electrode material from entering between the touching faces 510 of the semiconductor laser devices 500 and the corresponding surfaces of the raised portions 561 of the optical integrated circuit substrate 550 when the semiconductor laser device 500 is secured to the optical integrated circuit substrate 550. With this construction, excess In is extruded outside the recessed portion 562 of the semiconductor laser device mounting region 560 without spreading over the planar raised portions 561.

In the above construction, the bonding between the semiconductor laser device 500 and the optical integrated circuit substrate 550 is accomplished by fusing the In layer formed on the recessed portion 562 in the semiconductor laser device mounting region of the optical integrated circuit substrate 550 and the Au layer formed on the mounting electrode 511 of the semiconductor laser device 500. Therefore, the thicknesses of these metal layers do not affect the dimensions of the completed optical integrated circuit device in the direction perpendicular to the layers. The mounting accuracy in the direction perpendicular to the layers is defined by the levelness of the touching faces 510 of the semiconductor laser device 500 and the surfaces of the raised portions 561 of the optical integrated circuit substrate 550. Therefore, the touching faces 510 and the surfaces of the raised portions 561 should be processed to have the levelness that matches the level of mounting accuracy required in the direction perpendicular to the layers of the optical integrated circuit device.

In the fifth example, MOCVD and plasma CVD techniques are used in the fabrication of the semiconductor laser device 500 and the optical integrated circuit substrate 550. As stated in the first example, these techniques have extremely high layer thickness control capabilities. Thus, the optical integrated circuit device of the fifth example having the above described assembly structure is fabricated with the high degree of thin layer control capabilities of MOCVD and plasma CVD techniques and the fine profile processing capabilities of RIE techniques.

The distance $d_{LD}$ between the touching faces 510 and a light-emitting stripe axis 530 in the semiconductor laser device 500 and the distance $d_{WG}$ between the surface of the raised portions 561 and a waveguide axis 590 in the optical integrated circuit substrate 550, when measured on the completed optical integrated circuit device, are typically $d_{LD}$=2.54 µm and $d_{WG}$=2.55 µm.

When these values of $d_{LD}$ and $d_{WG}$ are substituted into an evaluation formula $|d_{LD}-d_{WG}|$ for evaluating the mounting accuracy in the direction perpendicular to the layers, the result is $|d_{LD}-d_{WG}|$= 0.01 µm. This value satisfies the critical value of 0.5 µm, which is required to ensure 3% or more optical coupling efficiency for the optical integrated circuit device.

In assembling the semiconductor laser device 500 and the optical integrated circuit substrate 550 having the structure according to the fifth example, the processing accuracies are reflected with good reproducibility in the positioning accuracies. Thus, accurate positioning can be achieved by simple mechanical operations. There is no need to mount each individual semiconductor laser device by constantly monitoring the light intensity, as in the case of the prior art. Furthermore, since the semiconductor laser device 500 and the optical integrated circuit substrate 550 can be handled on completed wafers, the mass productivity of the optical integrated circuit device is greatly improved. Moreover, the semiconductor laser device 500 need not be energized to emit light during assembly, which serves to prevent heat degradation of the semiconductor laser device 500, and improve the production yield.

Figure 7C:
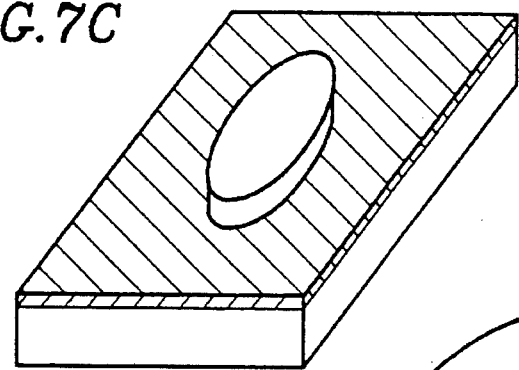

In the fifth example, the raised portions 561 that provide touching areas in the semiconductor laser device mounting region 560 of the optical integrated circuit substrate 550 are each formed in a rectangular shape in cross section, but the shape is not limited to the illustrated one. Each raised portion 561 may be formed circular in cross section as shown in FIG. 7C.

Figure 7D:
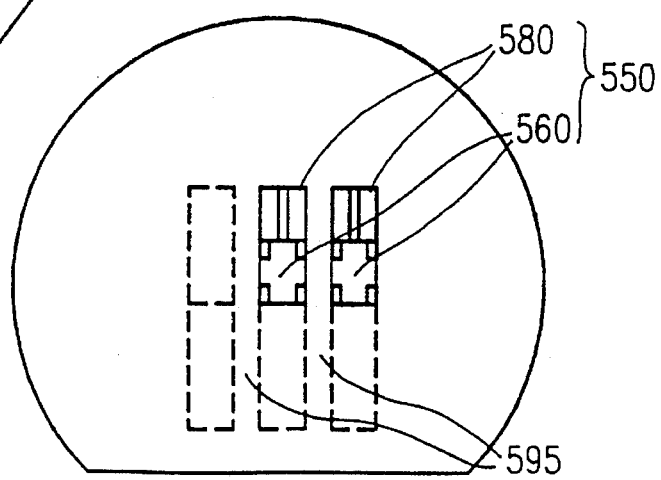

Further, as shown in FIG. 7D, when fabricating the optical integrated circuit substrates 550 in wafer form, it is desirable that the optical integrated circuit substrates be patterned so that an appropriate space 595 is provided between them. When mounting the semiconductor laser device 500 on each optical integrated circuit substrate 550 fabricated on the wafer, the presence of the space 595 serves to prevent excess electrode material (In) from penetrating into the butting faces between the semiconductor laser device 500 and the optical integrated circuit substrate 550 by allowing such excess material to run into the space 595.

EXAMPLE 6

Figure 8A:
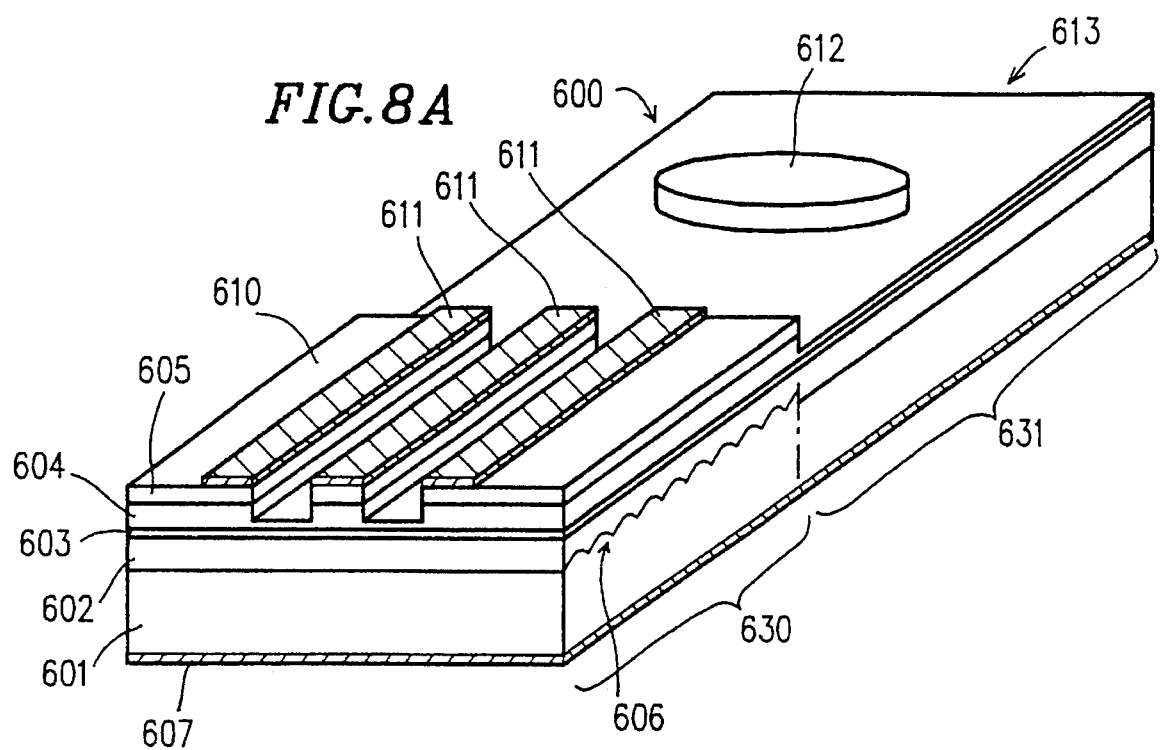
FIGS. 8A and 8B are diagrams illustrating an assembly structure in accordance with a sixth example of the invention.

A sixth example will be described below which concerns an assembly structure for an optical integrated circuit device that can easily achieve the mounting accuracies in the direction parallel to the layers and perpendicular to the light-emitting stripe axis (or the waveguide axis), as well as in the direction perpendicular to the layers, required to obtain the prescribed optical coupling efficiency for the optical integrated circuit device. FIG. 8A is a perspective view showing a semiconductor laser device 600 and an optical integrated circuit substrate 650 according to the sixth example.

The semiconductor laser device 600 of the sixth example is an ordinary distributed-feedback (DFB) semiconductor laser fabricated by one MOCVD processing step, with transverse-mode control being a ridge-waveguide type. This semiconductor laser device 600 has, as shown in FIG. 8A, an n-InP substrate 601 that serves as a base, on top of which a 0.2 μm thick n-InGaAsP guide layer 602, a 0.2 μm thick InGaAsP active layer 603, a 2.0 μm thick p-InP cladding layer 604, and a 0.5 μm thick p-InGaAs contact layer 605 are deposited one on top of another in this order. Further, a diffraction grating 606 with a grating interval of 200 nm is formed on the n-InP substrate 601.

The semiconductor laser device 600 of the sixth example is divided into a light-emitting region 630 and a waveguide region 631, each extending over a prescribed distance along the longitudinal direction of the device 600. In the light-emitting region 630, two equidistant parallel grooves symmetric to each other with respect to a light-emitting stripe axis (not shown) are formed in the p-InGaAsP contact layer 605. These two grooves are rectangular in cross section. Mounting electrodes 611 are formed on portions of the surface of the p-InGaAsP contact layer 605 where the grooves are not formed.

In the waveguide region 631, a mode index lens 612 whose center lies on the waveguide axis (or the light-emitting stripe axis, neither axis shown) is formed with its surface lying at the same level as the surface of the p-InGaAsP contact layer 605. This mode index lens 612 is formed by etching off its surrounding regions until the etching reaches below the surface of the p-InP cladding layer 604. The semiconductor laser device 600 is fabricated in the following sequence.

First, a wafer is fabricated with the above-mentioned layers formed thereon using a photolithographic technique, such as a holographic exposure method, and an MOCVD crystal growth technique. Next, using ordinary photolithography and reactive ion beam etching (RIBE) techniques, the ridge structure and the mode index lens 612 are formed simultaneously in the p-InGaAsP contact layer 605. Then, an ohmic electrode (not shown) is formed on the surface of the n-InP substrate 601 as well as on the surface of the p-InGaAsP contact layer 605. After that, as in the fifth example, the mounting electrodes 611 are formed on the surface of the p-InGaAsP contact layer 605 in the light-emitting region 630 by a lift-off technique using a photoresist. A mounting electrode 607 is formed also on the surface of the n-InP substrate 601. Finally, such semiconductor laser devices 600 fabricated on the wafer are separated into individual chips, thus obtaining the semiconductor laser device 600 in chip form.

Next, the optical integrated circuit substrate 650 of the sixth example will be described below.

Figure 8B:
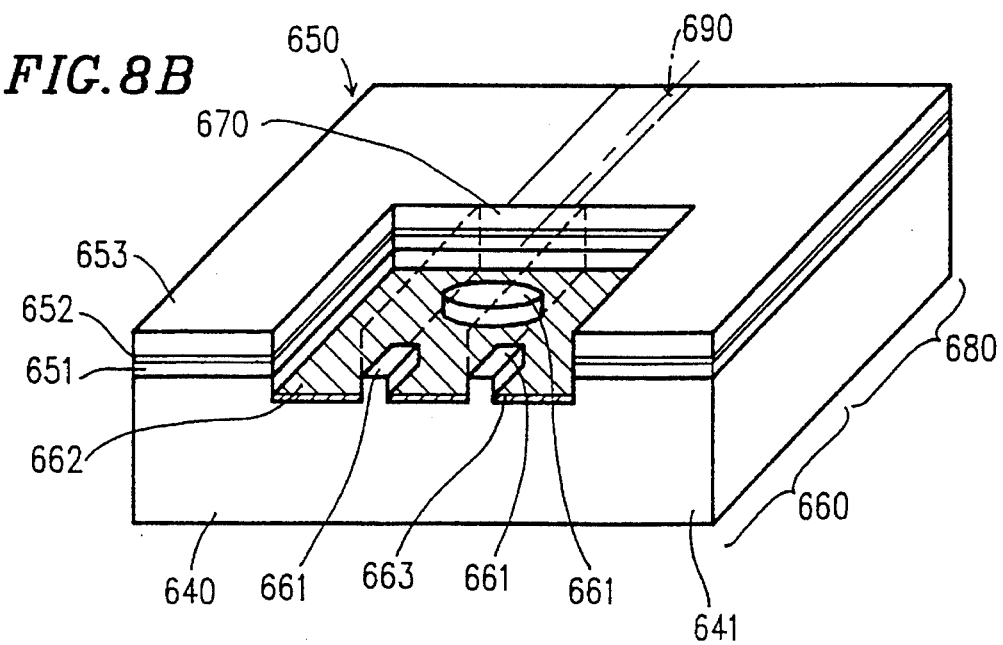

This optical integrated circuit substrate 650 has, as shown in FIG. 8B, an Si substrate 640 on which an $SiO_2$ first cladding layer 651, a $TiO_2$ (titanium dioxide) core layer 652, and an $SiO_2$ second cladding layer 653 are formed one on top of another in this order. In this optical integrated circuit substrate 650, the region starting from one facet 641 and extending over a prescribed distance in the longitudinal direction is the semiconductor laser device mounting region 660, and the remaining region is the waveguide region 680.

In the semiconductor laser device mounting region 660, there is opened a space having a volume approximately equal to that of the semiconductor laser device 600, leaving therein three raised portions 661 against which the semiconductor laser device 600 is to abut from above. This space is symmetrical about a line 690 along which the light-emitting stripe axis of the semiconductor laser device 600 is expected to pass (after the semiconductor laser device 600 is mounted in place, this line becomes the same as the light-emitting stripe axis 690, and also lies on the extension of the waveguide axis 690). The facet 641 and the surface of the $SiO_2$ second cladding layer 653 provide the reference planes to define this space.

Of the three raised portions 661, two are rectangular in cross section and the third one is cylindrical. The raised portions 661 of rectangular cross section provide the butting faces against which portions of the raised structure on the surface of the semiconductor laser device 600 where the electrodes 661 are not formed are made to abut. On the other hand, the cylindrical raised portion 661 has its cylindrical axis on the line 690 along which the light-emitting axis is expected to pass, and provides the butting face against which the surface of the mode index lens 612 of the semiconductor laser device 600 is made to abut.

The optical integrated circuit substrate 650 having the above structure is fabricated in the following sequence.

First, the $SiO_2$ first cladding layer 651 of 2.5 μm thickness, the $TiO_2$ core layer 652 of 0.14 μm thickness, and the $SiO_2$ second cladding layer 653 of 1.6 μm thickness are successively deposited by RF sputtering in this order with identical surface geometry over the surface of the Si substrate 640.

Next, the semiconductor laser device mounting region 660 is formed using ordinary photolithography and RIE techniques. As shown in FIG. 8B, in the region 660, the second cladding layer 653, the core layer 652, and the first cladding layer 651 are removed over an area longer than the length of the semiconductor laser device 600, as measured from the facet 641 of the optical integrated circuit substrate 650. Thus, the surface of the underlying Si substrate 640 is exposed in the region 660. The region left unetched is the waveguide region 680.

The amount of etching (etching depth) can be detected with high accuracy by monitoring the emission intensity of the plasma in real time. It is desirable that the etching conditions be selected so that the facet 670 of the waveguide region 680 formed by the etching is flat and perpendicular to the exposed surface of the Si substrate 640.

Further, using photolithography and etching techniques, the cylindrical raised portion 661 having its center on the waveguide axis 690 and the rectangular raised portions 661 symmetric to each other with respect to the waveguide axis 690 are formed to a thickness of 1 μm on the surface of the Si substrate 640 in the semiconductor laser device mounting region 660.

Next, an Au layer is deposited over the surface of a recessed portion 662 in the semiconductor device mounting region 660, i.e., over the surface areas except the three raised portions 661, to form a mounting electrode 663. An In layer is deposited to a thickness of 1 μm on top of the Au layer. After the deposition, it is desirable that the excess electrode material deposited on the surfaces of the raised portions 661, on the waveguide facet 670, and on the waveguide region 680 be removed by photolithography.

Finally, such optical integrated circuit substrates 650 fabricated on the wafer are separated by cleaving into individual chips, thus obtaining the optical integrated circuit substrate 650 in chip form.

The thus fabricated semiconductor laser device 600 and optical integrated circuit substrate 650 are bonded together in the following manner.

First, the mounting electrodes 611 of the semiconductor laser device 600 are placed in intimate contact with the In layer formed in the semiconductor laser device mounting region 660 of the optical integrated circuit substrate 650. In this condition, a pressure of about 15 g is applied to the semiconductor laser device 600 from the n-InP substrate 601 side thereof. With the pressure applied in this manner, the optical integrated circuit substrate 650 is heated to 280° C. and is held at that temperature for about 15 seconds. In this process, the Au layer formed on the semiconductor laser device 600 is alloyed with the In layer formed on the optical integrated circuit substrate 650. The semiconductor laser device 600 and the optical integrated circuit substrate 650 are bonded together by the adhesion of the two metal layers.

In the assembly structure of the sixth example also, the bonding between the semiconductor laser device 600 and the optical integrated circuit substrate 650 is accomplished by fusing the Au layer on the mounting electrode 611 in the raised structure 610 of the semiconductor laser device 600 and the In layer on the mounting electrode 663 in the recessed portion 662 of the semiconductor laser device mounting region 660 of the optical integrated circuit substrate 650. As noted earlier, the thicknesses of these metal layers do not affect the mounting accuracy in the direction perpendicular to the layers. The mounting accuracy in the direction perpendicular to the layers is defined solely by the levelness of the touching faces 610 and 612 of the semiconductor laser device 600 and the surfaces of the three raised portions 661 of the optical integrated circuit substrate 650.

In the sixth example, the distance $d_{LD}$ in the semiconductor laser device 600 from the touching faces 610 (or 612) to the light-emitting stripe axis 690, and the distance $d_{WG}$ in the optical integrated circuit substrate 650 from the surfaces of the raised portions 661 to the waveguide axis 690, measured on the completed optical integrated circuit device, are typically $d_{LD}$=2.55 μm and $d_{WG}$=2.57 μm.

Evaluating the value of $|d_{LD}-d_{WG}|$, as in the fifth example, the result is $|d_{LD}-d_{WG}|$=0.02 μm. This value satisfies the critical value, 0.5 μm, for the mounting accuracy in the direction perpendicular to the layers, required to ensure 3% or more optical coupling efficiency for the optical integrated circuit device.

In the sixth example, the semiconductor laser device 600 incorporates a mode index lens 612. The laser light generated in the light-emitting region 630 is coupled directly into the waveguide (not shown) in the waveguide region 631. The laser light is converged by the mode index lens 612 for higher collimation. Since the waveguide region 631 does not have a waveguiding mechanism for the direction perpendicular to the waveguide, the highly collimated laser light is emitted from the light-emitting facet 613 of the waveguide region 631. Therefore, there is no need to provide a waveguide defining structure on the optical integrated circuit substrate 650 as provided in the foregoing examples. Furthermore, no alignment is necessary in the direction parallel to the layers and perpendicular to the light-emitting stripe axis (or the waveguide axis) 690.

Thus, according to the sixth example, the processing accuracies of the semiconductor laser device 600 and the optical integrated circuit substrate 650 fabricated by fine profile processing techniques such as MOCVD and RIE are reflected with Good reproducibility in the positioning accuracy in the direction perpendicular to the layers. In addition, since there is no need for alignment in the direction parallel to the layers and perpendicular to the light-emitting stripe axis (or the waveguide axis) 690, the effect of the invention can be easily achieved, that is, the accurate alignment between the semiconductor laser device 600 and the optical integrated circuit substrate 650 can be easily accomplished by simple mechanical operations.

Furthermore, because of the mode index lens (a light converging means), collimation of the light emitted from the semiconductor laser device can be increased. This makes it easier to bring the light-emitting stripe axis into alignment with the waveguide axis in a plane parallel to the layers.

As in the foregoing examples, since both devices 600 and 650 can be handled on completed wafers, mass productivity is greatly improved and the production yield can be increased.

The mode index lens 612 described in the sixth example is of the mode-index type as shown in FIG. 8A, but it is not limited to the illustrated type. For example, other types of mode-index lenses, such as a Runeburg lens, may be used. Alternatively, a geodesic lens, a Fresnel lens, a grating lens, etc. may also be used.

EXAMPLE 7

The foregoing fifth and sixth examples have dealt with assembly structures that can achieve the mounting accuracy in the direction perpendicular to the layers by simple mechanical operations. The seventh example hereinafter described deals with another assembly structure of an optical integrated circuit device for achieving the specified mounting accuracy in the direction parallel to the layers and perpendicular to the light-emitting stripe axis (or the waveguide axis).

Figure 9A:
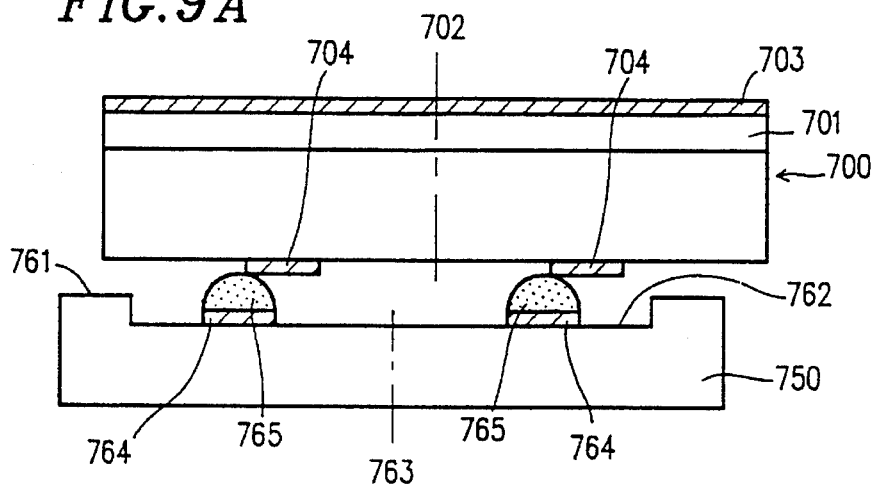
FIGS. 9A–9C are diagrams illustrating an assembly structure in accordance with a seventh example of the invention.
Figure 9B:
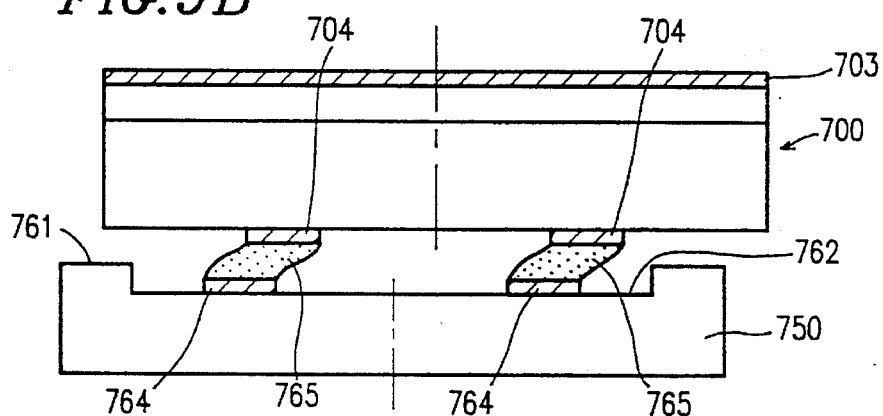
Figure 9C:
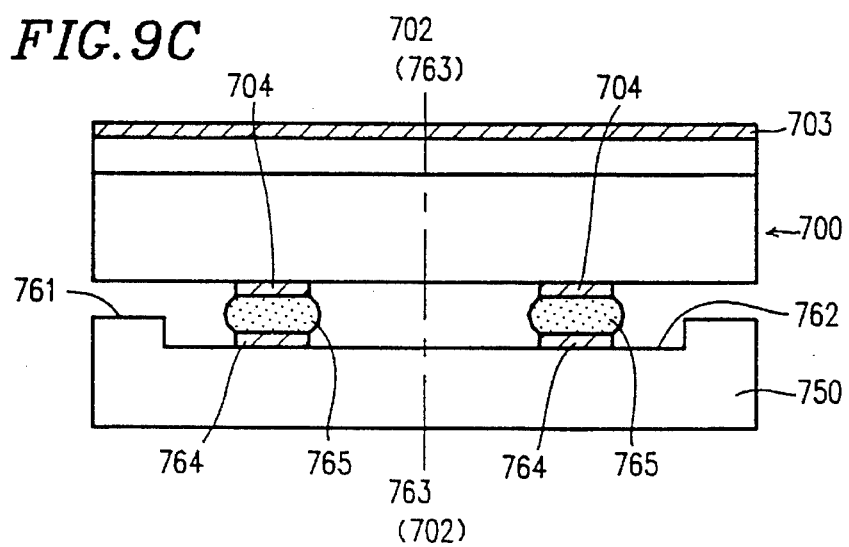

FIGS. 9A to 9C are simplified schematic diagrams showing a mounting sequence for a semiconductor laser device 700 and an optical integrated circuit substrate 750 having the assembly structure according to the seventh example. Detailed description or diagrammatic illustration will not be given here of the structures and fabrication sequences for the semiconductor laser device 700 and the optical integrated circuit substrate 750.

The optical integrated circuit substrate 750 shown in FIGS. 9A to 9C is viewed from the position facing the facet of the semiconductor laser device mounting region. The basic structure of the entire optical integrated circuit substrate 750 is the same as those described in the foregoing examples.

The semiconductor laser device 700 of the seventh example has an n-GaAs substrate 701. An ohmic electrode (not shown) is formed over the entire surface of the n-GaAs substrate 701, and an Al layer 703 as a mounting electrode is formed in such a manner as to cover the ohmic electrode. An ohmic electrode (not shown) is formed also on the surface of a grown layer on the side opposite from the n-GaAs substrate 701. On this ohmic electrode there are formed cylindrical electrodes 704, each with a diameter of 5 μm, that are disposed symmetric to each other with respect to the light-emitting stripe axis 702.

On the other hand, in the semiconductor laser device mounting region of the optical integrated circuit substrate 750, cylindrical electrodes 764, each with a diameter of 5 μm, symmetric to each other with respect to the waveguide axis 763, are formed on a recessed portion 762 in the center of the mounting region, as shown in FIG. 9a. A 5 μm diameter bump 765 made of an AuSn alloy is formed on each of the electrodes 764.

The optical integrated circuit substrate 750 may be a GaAs substrate. Since the material is the same as the substrate of the semiconductor laser device 700, thermal stability is improved as compared to a silicon substrate.

As in the foregoing examples, the semiconductor laser device mounting region is formed on the optical integrated circuit substrate 750 by etching a designated portion thereof. In the mounting region, raised portions 761 that provide the butting faces with the semiconductor laser device 700 are formed along the longitudinal sides thereof.

The semiconductor laser device 700 and the optical integrated circuit substrate 750 are bonded together in the following manner.

First, the semiconductor laser device 700 is positioned, with the cylindrical electrodes 704 contacting the bumps 765 in the semiconductor laser device mounting region of the optical integrated circuit substrate 750. FIG. 9A shows this condition. Next, the semiconductor laser device 700 and the optical integrated circuit substrate 750 held in this condition are heated up to 300° C. and held at that temperature for five seconds. The bumps 765 are melted by the heat, as shown in FIG. 9B, and due to the surface tension, the cylindrical axes of the cylindrical electrodes 704 on the semiconductor laser device 700 are self-aligned to the cylindrical axes of the corresponding cylindrical electrodes 764 on the optical integrated circuit substrate 750. This condition is shown in FIG. 9C. In this condition, a pressure of 15 g is applied to the semiconductor laser device 700 from the n-GaAs substrate 701 side thereof, thereby holding the semiconductor laser device 700 in intimate contact with the optical integrated circuit substrate 750 via their respective butting faces. The molten metal is allowed to cool down, and the two devices are thus bonded together.

According to this method, horizontal alignment is achieved in self-aligning fashion, and a mounting accuracy of 0.5 μm can be attained.

In the seventh example also, the mounting accuracy in the horizontal direction can be held, only by simple mechanical operations, within the critical value of 1 μm required to ensure the 3% optical coupling efficiency specified in the fabrication of the optical integrated circuit device.

As described above, in the assembly structure of the optical integrated circuit device for assembling the semiconductor laser device and the optical integrated circuit substrate according to the present invention, the semiconductor laser device forming one part of the optical integrated circuit device includes a recessed/raised structure. On the other hand, the optical integrated circuit substrate includes another recessed/raised structure to fit the recessed/raised structure of the semiconductor laser device.

The recessed/raised structures are formed so that their cross sections taken parallel to the layers forming the semiconductor laser device are symmetric in shape about the respective optical axes of the semiconductor laser device and the optical integrated circuit substrate. Further, the recessed/raised structures preferably contain a tapered portion in part of its contour, the taper forming a prescribed angle with the respective optical axes.

With the assembly structure of the invention described above, when mounting the semiconductor laser device on the optical semiconductor circuit substrate, the mounting accuracy required to achieve the prescribed coupling efficiency in the optical integrated circuit device can be obtained by simple mechanical operations. Therefore, since both the semiconductor laser device and the optical integrated circuit substrate can be mounted as fabricated on wafers, the mass production efficiency for the optical integrated circuit device dramatically increases. Furthermore, since the semiconductor laser device need not be energized to emit light during the mounting process, there is no concern of semiconductor device degradation due to the heat generated by light emission. This greatly improves the fabrication yield.

The semiconductor laser device and the optical integrated circuit substrate may also be bonded together using other areas than the butting faces in the semiconductor laser device mounting region of the optical integrated circuit substrate. In that case, the mounting accuracy in the direction perpendicular to the layers depends solely on the processing accuracy of the butting faces.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An assembly structure for an optical integrated circuit device, comprising:

an optical integrated circuit substrate in which a layered structure including a waveguide is formed on a base, the optical integrated circuit substrate having a first surface profile on an opposite surface of the base, the first surface profile including a first structure which is one of a raised structure and a recessed structure; and a semiconductor laser device to be secured on the optical integrated circuit substrate, the semiconductor laser device having a plurality of layers and a second surface profile on a surface of the layers, the second surface profile corresponding to the first surface profile and including a second structure which has a shape corresponding to the first structure on the optical integrated circuit substrate, wherein the first structure extends parallel to a waveguide axis of the optical integrated circuit substrate, a cross-sectional shape of the first structure taken parallel to the base is symmetrical with respect to the waveguide axis, and the first structure includes a first tapered profile, the second structure extends parallel to a light-emitting stripe axis of the semiconductor laser device, a cross-sectional shape of the second structure taken parallel to the layers is symmetrical with respect to the light-emitting stripe axis, and the second structure includes a second tapered profile which corresponds to the first tapered profile of the first structure, and the first and second surface profiles are fitted to and bonded with each other so as to secure the semiconductor laser device to the optical integrated circuit substrate.

2. An assembly structure according to claim 1, wherein the first surface profile comprises a plurality of the first structures and the second surface profile comprises a plurality of the second structures.

3. An assembly structure according to claim 1, wherein one of the first surface profile and the second surface profile further comprises a groove for venting air from an interface between the first and second surface profiles in fitting and bonding the first and second surface structures.

4. An assembly structure for an optical integrated circuit device, comprising:

an optical integrated circuit substrate in which a layered structure including a waveguide is formed on a base, the optical integrated circuit substrate having a first surface profile on an opposite surface of the base; and a semiconductor laser device to be secured on the optical integrated circuit substrate, the semiconductor laser device having a plurality of layers and a second surface profile on a surface of the layers, the second surface profile corresponding to the first surface profile, wherein the first and second surface profiles are faced to and bonded with each other so as to secure the semiconductor laser device to the optical integrated circuit substrate, and at least one of the first surface profile and the second surface profile comprises at least one raised portion providing a touching face which is brought into contact with a corresponding touching face in the opposite surface profile, the touching faces being used for controlling dimension in a direction perpendicular to the layers in the semiconductor laser device in facing and bonding of the semiconductor laser device and the optical integrated circuit substrate.

5. An assembly structure according to claim 4, wherein the semiconductor laser device further comprises a light converging means for increasing collimation of light emitted from the semiconductor laser device.

* * * * *